(12) United States Patent
Suzuki et al.

(10) Patent No.: US 7,629,652 B2
(45) Date of Patent: Dec. 8, 2009

(54) SEMICONDUCTOR DEVICE WITH SIGNAL WIRINGS THAT PASS THROUGH UNDER THE OUTPUT ELECTRODE PADS AND DUMMY WIRINGS NEAR THE PERIPHERAL PORTION

(75) Inventors: Shinya Suzuki, Kodaira (JP); Kazuhisa Higuchi, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/353,156

(22) Filed: Feb. 14, 2006

(65) Prior Publication Data

US 2006/0180864 A1  Aug. 17, 2006

(30) Foreign Application Priority Data

Feb. 15, 2005  (JP) .............................. 2005-037129

(51) Int. Cl.
*H01L 23/62* (2006.01)
*H01L 23/522* (2006.01)
*H01L 23/485* (2006.01)

(52) U.S. Cl. .................. 257/355; 257/776; 257/E23.02

(58) Field of Classification Search ................. 257/355, 257/360, 698, 700, 776, E23.019, E23.02, 257/E27.016, E29.219

See application file for complete search history.

(56) References Cited

U.S. PATENT DOCUMENTS

| 5,514,892 A * | 5/1996 | Countryman et al. ....... 257/355 |
| 6,825,504 B2 * | 11/2004 | Ishizuka et al. ............. 257/173 |
| 7,102,223 B1 * | 9/2006 | Kanaoka et al. ............. 257/700 |
| 2003/0038771 A1 * | 2/2003 | Sunohara ..................... 345/103 |
| 2004/0188763 A1 * | 9/2004 | Taniguchi et al. ........... 257/355 |
| 2004/0251940 A1 * | 12/2004 | Hayashi et al. ............. 327/170 |
| 2006/0001101 A1 * | 1/2006 | Hirata ........................ 257/355 |

FOREIGN PATENT DOCUMENTS

| JP | 2002-246470 | 8/2002 |
| JP | 2004-095577 | 3/2004 |

\* cited by examiner

*Primary Examiner*—Anh Phung
*Assistant Examiner*—Allison P Bernstein
(74) *Attorney, Agent, or Firm*—Antonelli, Terry, Stout & Kraus, LLP.

(57) ABSTRACT

Signal lines which provide electric connections from an internal circuit formed on a main surface of a semiconductor chip and including, for example, MIS transistor to protective elements constituted by, for example, diodes are drawn out from outlet ports formed on wiring lines disposed between the protective elements, and a signal line region occupied by the signal lines is provided over the protective elements and under electrode pads. A wiring region on the main surface of the semiconductor chip can be enlarged without increasing the chip area.

17 Claims, 17 Drawing Sheets

SEMICONDUCTOR DEVICE WITH SIGNAL WIRINGS THAT PASS THROUGH UNDER THE OUTPUT ELECTRODE PADS AND DUMMY WIRINGS NEAR THE PERIPHERAL PORTION

CROSS-REFERENCE TO RELATED APPLICATION

The present application claims priority from Japanese patent application No. 2005-037129 filed on Feb. 15, 2005, the content of which is hereby incorporated by reference into this application.

BACKGROUND OF THE INVENTION

The present invention relates to a semiconductor device and particularly to a technique applicable effectively to a liquid crystal display (LCD) driver for use in a portable telephone or a large-sized display.

For example in such a semiconductor device as an LCD driver, a very large amount of signals are transmitted from the semiconductor device to a liquid crystal panel as the definition of a liquid crystal display screen becomes even higher and therefore there now exists a demand for multi-output of the semiconductor device, that is, an increase in the number of bumps as external terminals of the semiconductor device and in the number of electrode pads formed under the bumps.

Due to requirements for ensuring high bonding strength and bonding accuracy and standards or the like established on the semiconductor chip mounting side, the size of each such electrode pad cannot be made so small in comparison with a dimensional reduction of semiconductor element and wiring. Therefore, in a multi-output type semiconductor device, there is adopted, for example, a method wherein electrode pads are provided in the region toward the inner side of a semiconductor chip where a semiconductor element and wiring are disposed.

In Patent Literature 1 there is a description to the effect that bases for plural electrode pads disposed in a region of a main surface of a semiconductor chip in which region are disposed a semiconductor element and wiring are made uniform to make the plural electrode pads uniform in height.

In Patent Literature 2 there is a description to the effect that protective elements are provided between an internal circuit formed in an LCD driver and electrode pads.

[Patent Literature 1]
Japanese Unexamined Patent Publication No. 2004-95577
[Patent Literature 2]
Japanese Unexamined Patent Publication No. 2002-246470

SUMMARY OF THE INVENTION

For such a semiconductor device as an LCD driver there exists a demand for reducing the area of a semiconductor chip. However, as noted above, the size of an electrode pad is difficult to be reduced in comparison with the size of a semiconductor element and that of wiring. Thus, there is a need for effectively using the region occupied by wiring, etc.

It is an object of the present invention to provide a technique which can enlarge a wiring region on a main surface of a semiconductor chip, particularly a signal wiring region in a semiconductor chip main surface of an LCD driver, without increasing the chip area.

The above and other objects and novel features of the present invention will become apparent from the following description and the accompanying drawings.

The following is an outline of a typical mode of the present invention as disclosed herein.

A semiconductor device comprising a first region disposed on an end side of a semiconductor chip of the semiconductor device such as an LCD driver, with a first protective element being formed in the first region, a second region disposed on an inner side of the semiconductor chip with respect to the first region, with a second protective element being formed in the second region, and a third region disposed on an inner side of the semiconductor chip with respect to the second region, with an internal circuit being formed in the third region, wherein an outlet port for a wiring line from the first and second protective elements is provided on the first region side of the second region, the wiring line providing an electric connection between the internal circuit and the first and second protective elements.

The following is a brief description of an effect obtained by the typical mode of the present invention as disclosed herein.

It is possible to enlarge the wiring area on a main surface of a semiconductor chip without increasing the area of the semiconductor chip.

DETAILED DESCRIPTION OF PREFERRED EMBODIMENTS

Figure 1:
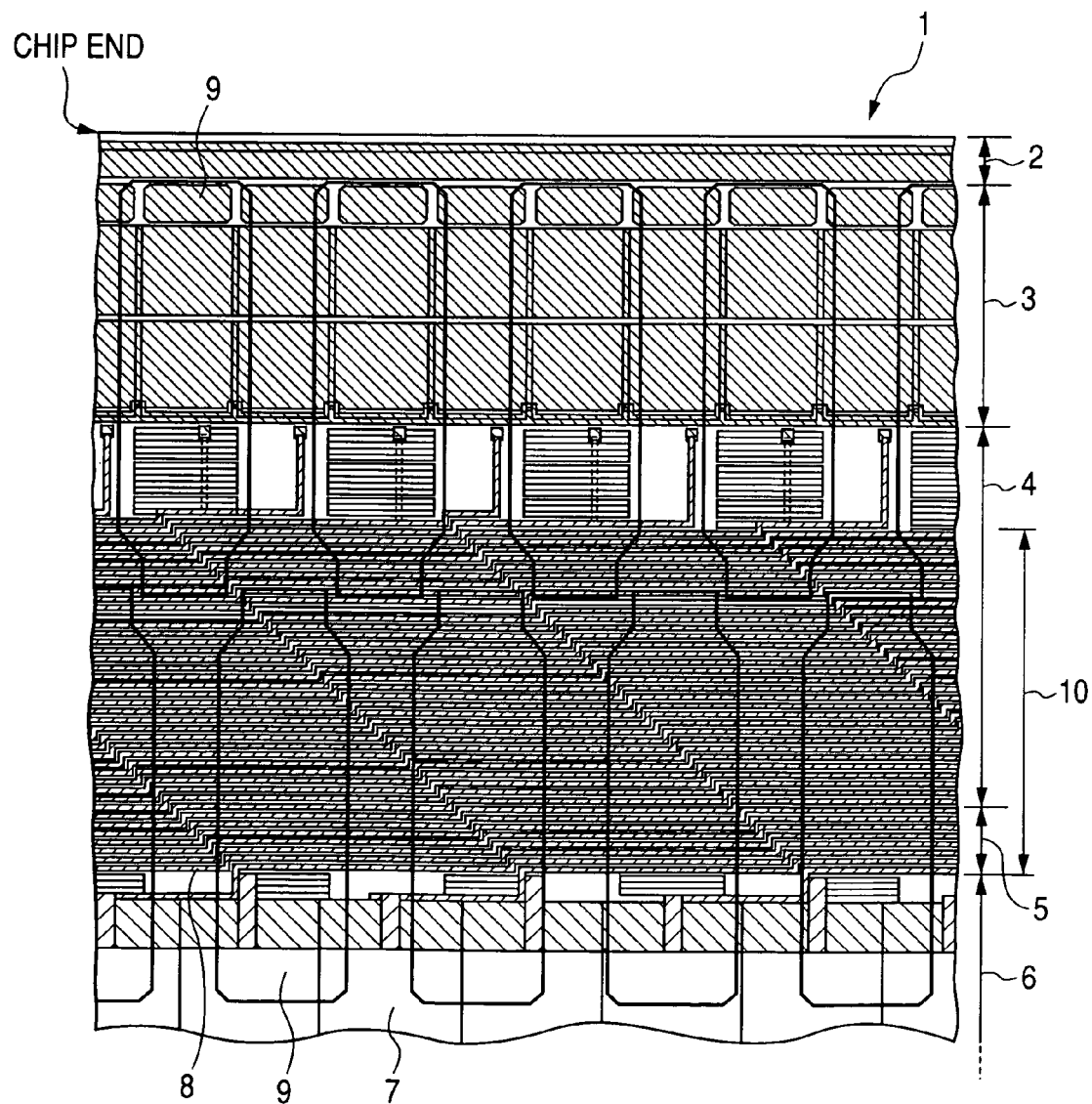
FIG. 1 is a plan view showing schematically a principal portion of a semiconductor device according to a first embodiment of the present invention.

Embodiments of the present invention will be described in detail hereinunder with reference to the accompanying drawings. In all of the drawings for illustrating the embodiments, the same members are identified by the same reference numerals, and repeated explanations thereof will be omitted.

Figure 20:
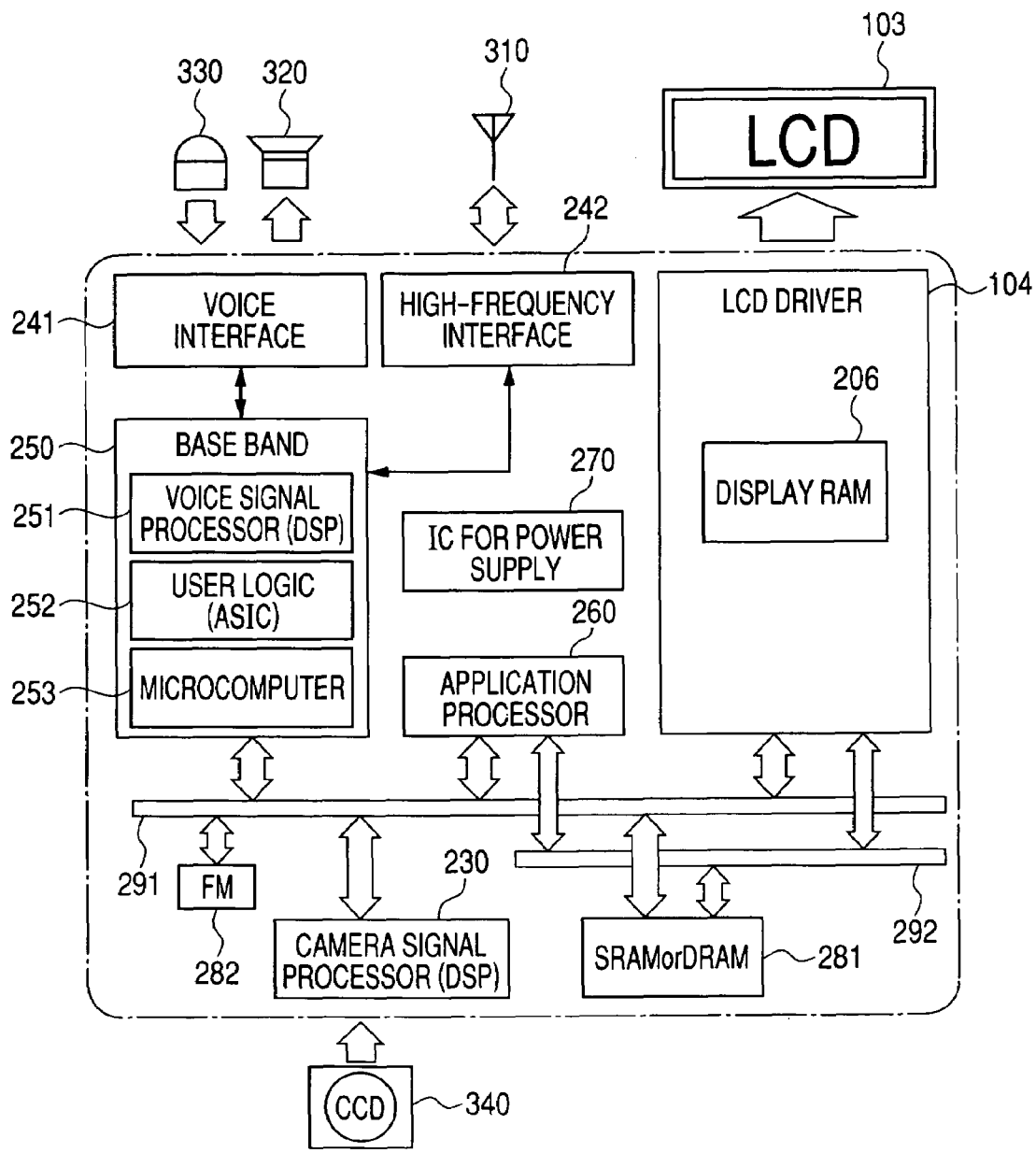
FIG. 20 is a block diagram showing an entire configuration of a portable telephone as an example of a system provided with an LCD driver according to the present invention.

FIG. 20 is a block diagram showing an entire configuration of a portable telephone as an example of a system provided with an LCD driver according to the present invention.

The portable telephone of this example includes an LCD display region (liquid crystal display region) 103 as display means, an antenna 310 for transmission and reception, a speaker 320 for voice output, a microphone 330 for voice input, a solid image pickup device 340 constituted, for example, by a CCD (charge coupled device) or MOS sensor, an image signal processor 230 constituted, for example, by a DSP (Digital Signal Processor) for processing image signals provided from the solid image pickup device 340, an LCD driver 104 as a liquid crystal display drive controller according to the present invention, a voice interface 241 for input and output of signals with respect to the speaker 320 and the microphone 330, a high-frequency interface 242 for input and output of signals between it and the antenna 310, a base band section 250 adapted to perform a signal processing, etc. for voice signals and transmission/reception signals, an application processor 260 constituted, for example, by a microprocessor having a multi-media processing function, e.g., moving picture processing in accordance with the MPEG (Moving Picture Expert Group) method, a resolution adjusting function and a Java high-speed processing function, an IC 270 for power supply, and memories 281 and 282 for the storage of data.

The application processor 260 further possesses a function of processing moving picture data received from another portable telephone through the high-frequency interface 242 in addition to image signals provided from the solid image pickup device 340. The liquid crystal controller driver 104, base band section 250, application processor 260, memories 281, 282 and image signal processing circuit 230 are connected together so as to permit the transfer of data through a system bus 291. In the portable telephone system shown in FIG. 20, a display data bus 292 is provided in addition to the system bus 291, and liquid crystal controller driver 104, application processor 260 and memory 281 are connected to the display data bus 292.

The base band section 250 is made up of a voice signal processor 251 constituted, for example, by a DSP (Digital Signal Processor) and adapted to perform a voice signal processing, an ASIC (application specific integrated circuits) 252 which provides a custom function (user logic), and a microcomputer 253 as a system controller which generates a base band signal, makes display control and controls the entire system.

Of the memories 281 and 282, the memory 281 is a volatile memory constituted usually by SRAM or SDRAM and is used for example as a frame buffer in which are stored image data resulting from various image processings. The memory 282 is a non-volatile memory and is constituted, for example, by a flash memory capable of being erased at a time in the unit of predetermined blocks. The memory 282 is used for the storage of control programs and control data for the entire portable telephone system, including display control.

In this system using such an LCD driver there may be used as the liquid crystal display region 103 a color TFT liquid crystal panel of a dot matrix type wherein display pixels are arranged in a matrix shape. Further, also in the case where the liquid crystal display region 103 has two TFT liquid crystal panels, it can be driven by a single LCD driver.

In connection with reducing the area of a semiconductor chip and obtaining a multi-output structure in a semiconductor device such as, for example, an LCD driver, a description will be given below about the contents which the present inventors have studied with reference to FIGS. 15 to 19.

Figure 16:
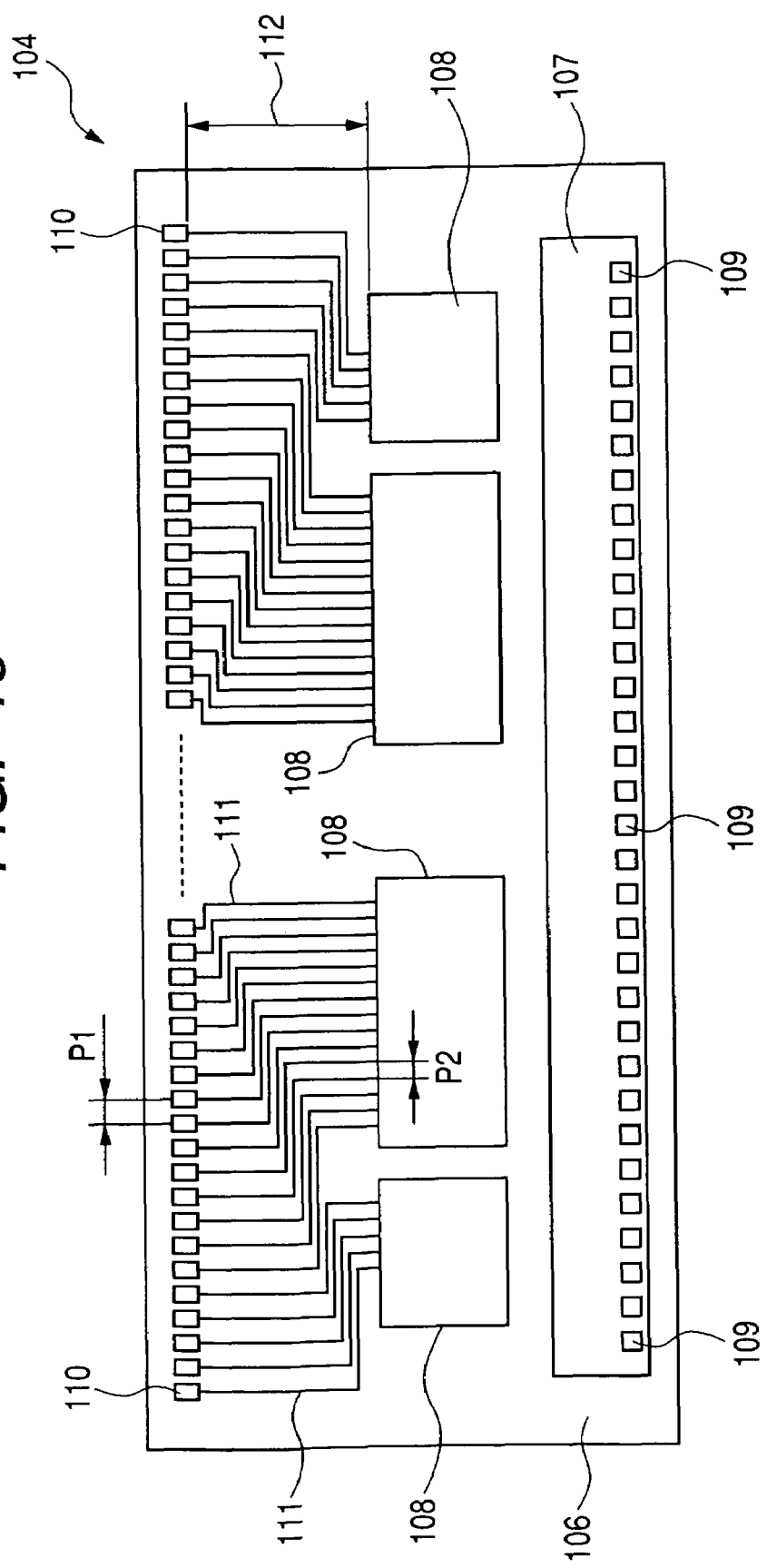
FIG. 16 is a plan view showing schematically an example of an LCD driver.
Figure 17:
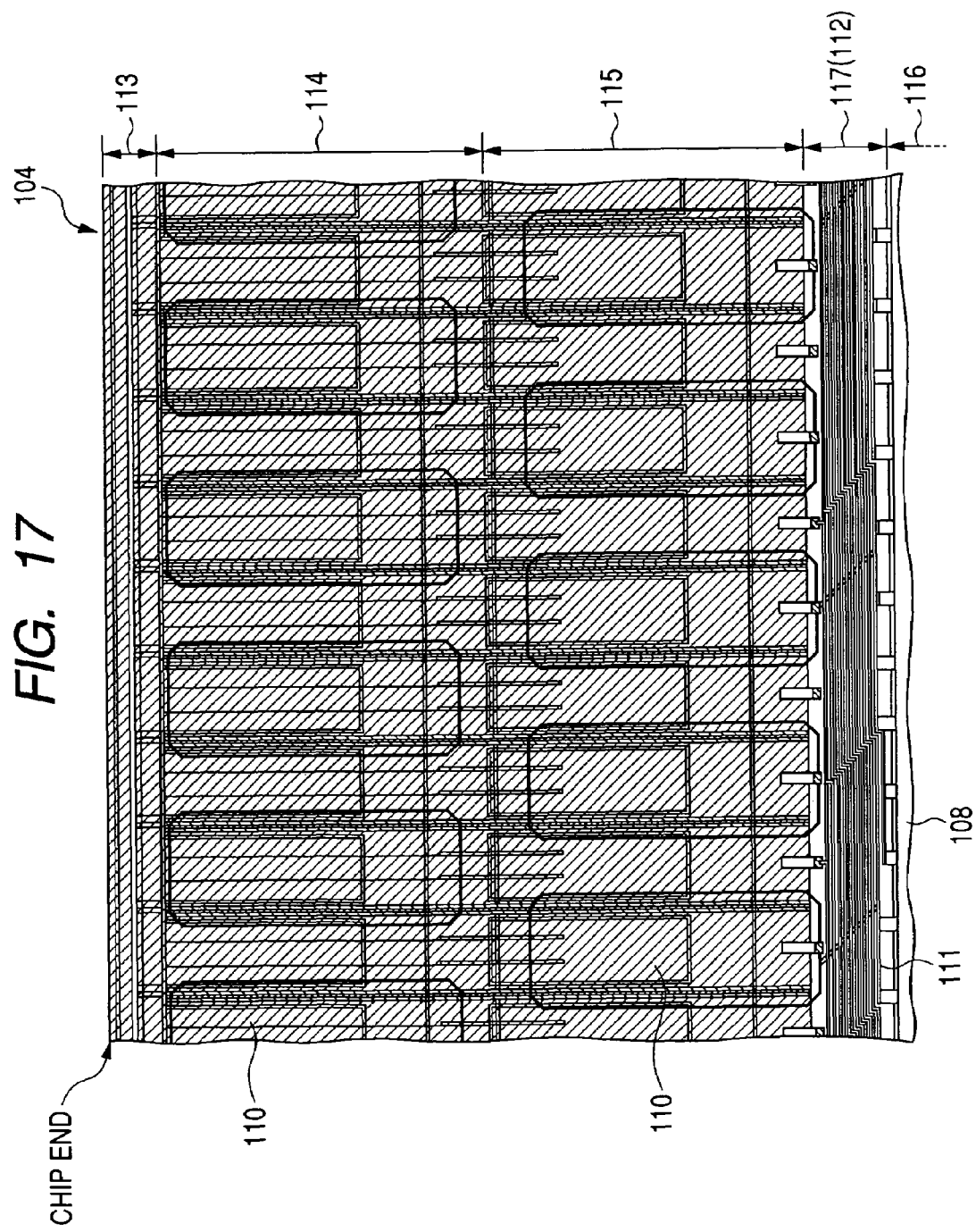
FIG. 17 is a plan view showing schematically a principal portion of an LCD driver which the present inventors have studied.
Figure 18:
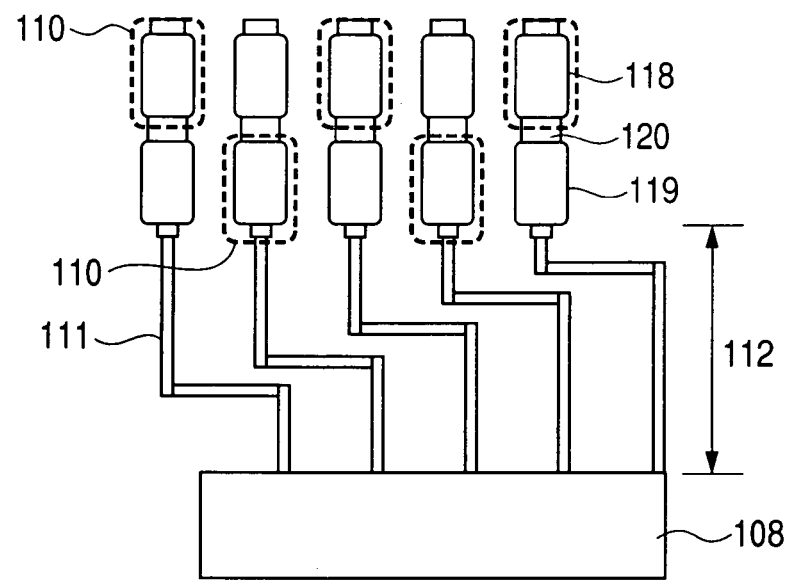
FIG. 18 is a plan view showing schematically an example of connection between an internal circuit and protective elements in the LCD driver which the present inventors have studied.
Figure 19:
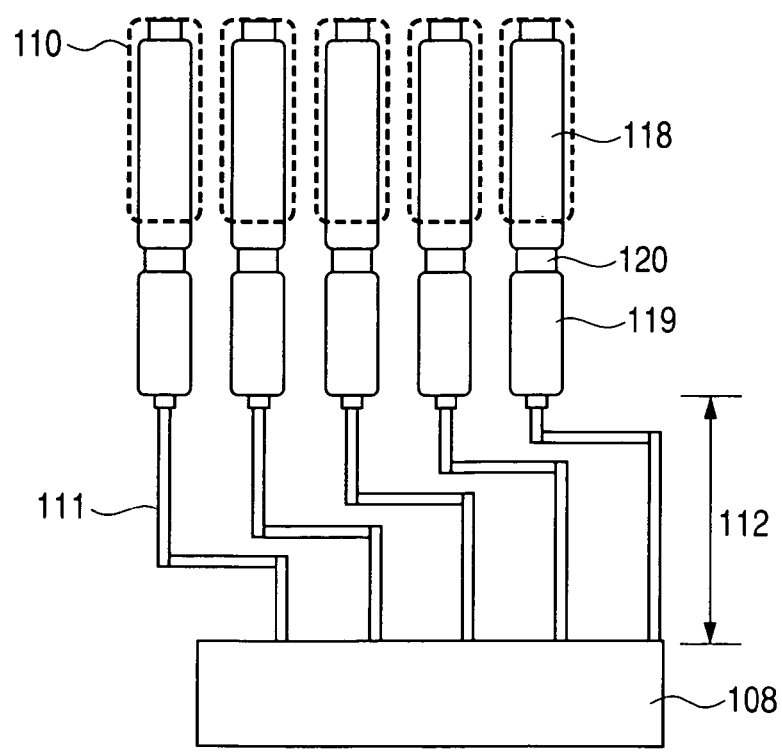
FIG. 19 is a plan view showing schematically another example of connection between an internal circuit and protective elements in the LCD driver which the present inventors have studied.

FIGS. 15(a) and 15(b) are plan views each showing schematically an LCD panel (liquid crystal display panel) 101. FIG. 16 is a plan view showing schematically an LCD driver 104. FIG. 17 is a plan view showing schematically a principal portion of the LCD driver 104. FIG. 18 is a plan view showing schematically a connection of an internal circuit 108 and protective elements 118, 119, with electrode pads 110 being arranged in a zigzag fashion. FIG. 19 is a plan view showing schematically a connection of the internal circuit 108 and protective elements 118, 119, with electrode pads 110 being arranged straight.

Figure 15:
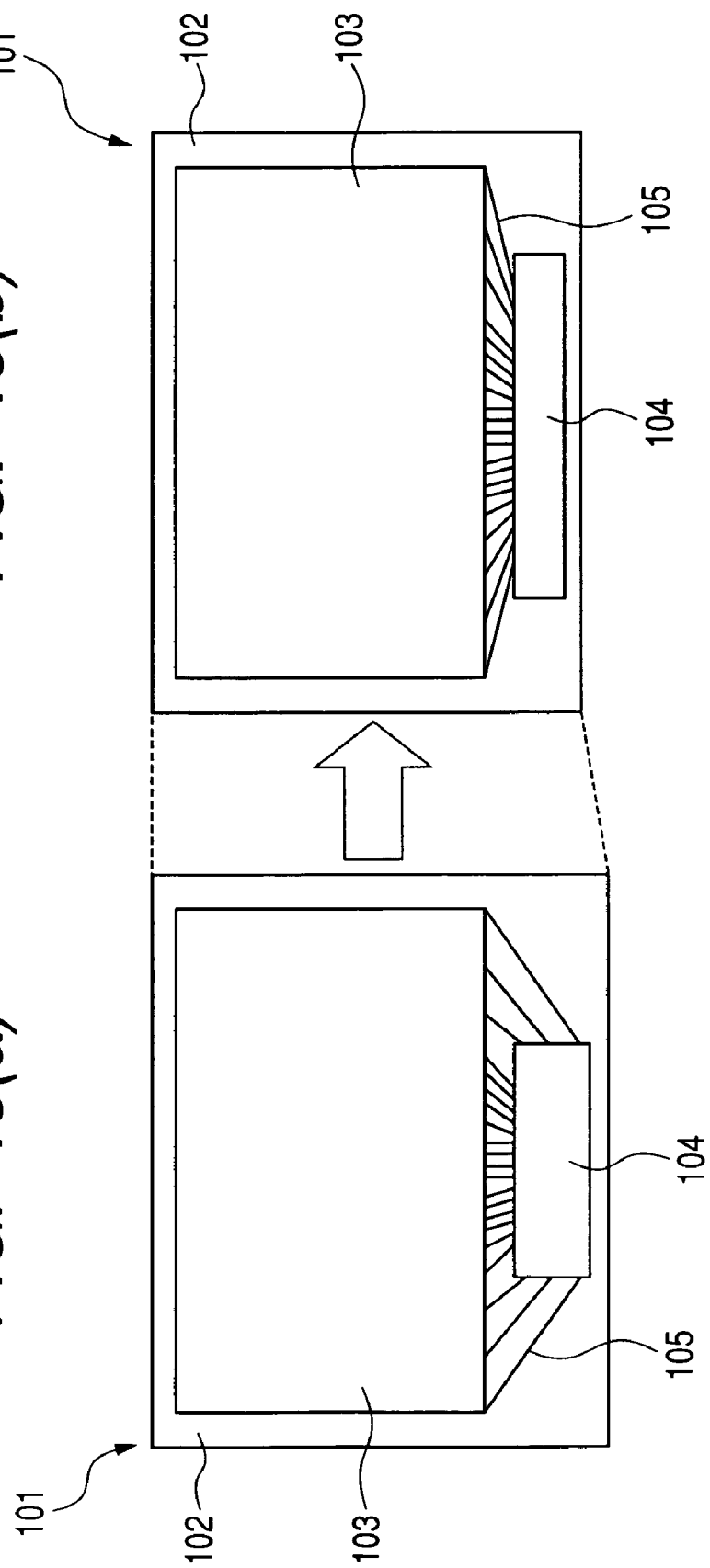
FIGS. 15(a) and 15(b) are plan views each showing schematically an example of an LCD panel.

As shown in FIG. 15, the LCD panel 101 includes an LCD display region disposed on a substrate 102 such as, for example, a glass substrate, an LCD driver 104 disposed near the LCD display region 103, and a back light (not shown) as a light source disposed on the back side of the LCD display region 103. In the LCD display region 103, plural pixels for a display screen are arranged in a matrix shape on the substrate 102 so as to be positioned respectively on intersecting points of pixel selecting gate lines and source lines (not shown). Further, plural substrate wiring lines 105 are formed on the substrate 102 to connect the gate and source lines electrically with bumps (external output terminals) of the LCD driver 104. Therefore, output signals provided from the LCD driver 104 turn ON or OFF the pixels in the LCD display region 103 through the substrate wiring lines 105.

Having made a study about reducing the size of an LCD panel, the present inventors found out for the first time that there were the following problems.

More particularly, as shown in a comparative manner in FIGS. 15(a) and 15(b), if the size of the LCD panel 101, i.e., the size of the substrate 102, is reduced, the chip area of the LCD driver 104 which is generally rectangular in a plan view is reduced even if the size of the LCD display region 103 remains unchanged. Moreover, as shown in FIG. 15(*b*), since the LCD driver 104 is disposed near and along the LCD display region 103, it is effective from the standpoint of reducing the chip area to take out all outputs from the long side of the LCD driver 104 located on the LCD display region 103, namely, adopt what is called one-side output, without taking out outputs from the short side of the LCD driver 104. That is, the electrode pads 110 are provided on a long side out of the four sides of the LCD driver 104 and are not provided on the short sides. Consequently, as shown in FIG. 15(*b*), the long sides of the LCD driver 104 become longer and the short sides thereof become shorter, so that a planar shape of the LCD driver 104 tends to become slimmer and it is possible to attain the reduction of the chip area, i.e., reduction of the LCD panel.

However, as will be described in detail below, there arises the problem that a multi-output structure results on a long side of the LCD driver 104.

As shown in FIG. 16, the LCD driver 104 which is generally rectangular in a plan view includes an input-side internal circuit 107 and output-side internal circuits 108, including for example MIS transistor and diodes, which are formed on a semiconductor substrate 106 constituting a semiconductor chip. Signals are inputted from the exterior to the internal circuit 107 through plural electrode pads 109 for input connected electrically to the internal circuit 107. On the other hand, output signals from the internal circuits 108 are outputted through plural electrode pads 110 for output connected electrically to the internal circuits 108. The internal circuits 108 disposed on the right and lefts sides are output circuits for the gate of TFT transistor in the LCD panel 101, while the central internal circuits 108 are output circuits for the source of the TFT transistor. Plural signal lines 111 are formed on the semiconductor substrate 106 to connect the internal circuits 108 and the electrode pads 110 electrically with each other. Numeral 112 denotes a signal line region occupied by the signal lines 111 on the semiconductor substrate 106.

For example as shown in FIG. 17, the electrode pads 110 for output of the LCD driver 104 are arranged in zigzags in two rows along a chip-end side of the LCD driver 104. In FIG. 17, the reference numeral 113 denotes a scribe region for cutting out each semiconductor chip from a semiconductor wafer, the numerals 114 and 115 denote element regions in which are formed protective elements (not shown), the numeral 116 denotes an element region in which are formed the internal circuits 108, and the numeral 117 denotes an element isolation region for insulation and separation between the element regions 115 and 116. For example, two protective elements are provided between power supply- and GND-internal circuits 108 for electrostatic protection.

The signal lines 111 shown in FIG. 16 are formed over the element isolation region 117. In FIG. 17, therefore, they are shown in an overlapped state with both signal line region 112 and element isolation region 117 shown in FIG. 16.

That is, as shown in FIG. 17, the scribe region 113, element region 114, element region 115, element isolation region 117 and element region 116 are arranged in this order from a chip end side toward a chip center side.

In FIG. 18 there is shown a state in which the electrode pads 110 for output are arranged in zigzags and protective elements 118 and 119 are connected electrically to an internal circuit 108. The protective elements 118 and 119 are electrically connected through wiring lines 120. The internal circuit 108 and the protective elements 119 are electrically connected through signal lines 111. More specifically, one ends of the signal lines 111 are drawn out from the protective elements 119 and opposite ends thereof are connected electrically to the internal circuit 108. Thus, the region occupied by the signal lines 111 drawn out from the protective elements 119 and connected to the internal circuit 108 is the signal line region 112.

In FIG. 19, the electrode pads 110 for output are arranged straight, but as is the case with the above zigzag layout, one ends of the signal lines 111 are drawn out from protective elements 119 and opposite ends thereof are connected electrically to the internal circuit 108.

As described earlier, pixels on the liquid crystal display screen are arranged in a matrix shape in the liquid crystal display region so as to be respectively positioned on intersecting points of pixel selecting gate lines and source lines. Therefore, as the definition of the liquid crystal display screen becomes higher, the number of the pixel selecting gate lines and source lines increases as well, that is, the number of the electrode pads 110 for the output provided from the LCD driver 104 to the gate and source lines increases.

Moreover, since it is necessary to ensure required bonding strength and bonding accuracy and meet the standard applied to the LCD panel 101 which is a chip mounting side, the size of each electrode pad 110 cannot be made small in comparison with the reduction in size of the signal lines 111, etc. For this reason, as the case may be, the chip area is determined by the number of electrode pads.

Further, as shown in FIG. 16, for forming bumps as external output terminals of the LCD driver 104 it is necessary that the electrode pads 110 for output serving as bases for the bumps be arranged at a pitch of P1. Therefore, the pitch P1 of the electrode pads 110 for output is larger than the pitch P2 of the signal lines 111 on the internal circuit 108 side to which signal lines are connected electrically to the electrode pads 110. As a result, the signal line region 112 occupied by the signal lines 111 also becomes larger.

That is, when reducing the chip area of the LCD driver 104, there arises the problem that an increase in the number of the electrode pads 110 for output located on a long side of the LCD driver 104 results in not only an increase in the number of the signal lines 111 but also an increase in size of the signal line region 112 and an increase of the chip area.

First Embodiment

With reference to FIGS. 1 to 11, a description will be given below about a semiconductor device according to a first embodiment of the present invention applied to an LCD driver for which the reduction of the area of a semiconductor chip and a multi-output structure are required.

FIG. 1 is a plan view showing schematically a principal portion of the semiconductor device indicated at 1. Electrode pads 9 are also shown in the same figure in a see-through state.

On a main surface of a semiconductor chip of the semiconductor device 1, a scribe region 2, element region 3, element region 4, element isolation region 5 and element region 6 are arranged in this order from a chip end side toward a chip center side (in the vertical direction in FIG. 1).

The element region 6 is a region in which is formed an internal circuit 7 including, for example, MIS transistor and diodes. The element isolation region 5 is a region in which is formed, for example, LOCOS (local oxidation of silicon) for insulating and isolating the region where such an element as MIS transistor for example is formed. There sometimes is a case where LOCOS is formed also in a region other than the element isolation region 5, but in this embodiment the region located between the element regions 4 and 6 is designated the element isolation region 5. The element isolation region 5 may be formed using a groove or trench type isolation region called SGI (Shallow Groove Isolation) or STI (Shallow Trench Isolation). For example, STI is formed by depositing an insulating film, e.g., oxide film or nitride film, into a trench formed in a semiconductor substrate. As will be described in detail later, signal lines 8 pass over the element isolation region 5, the signal lines 8 being disposed between the internal circuit 7 and electrode pads 9 to connect the two electrically with each other.

The scribe region 2 is a region for cutting out the semiconductor chip from a semiconductor wafer. The element regions 3 and 4 are regions in which protective elements are formed to protect the internal circuit 7 from static electricity and thereby prevent electrostatic breakdown of the gate insulating film of MIS transistor for example.

Electrode pads 9 are arranged in zigzags in two rows along a chip end side of the semiconductor device 1. In this embodiment the electrode pads 9 are arranged on the element regions 3, 4, element isolation region 5 and element region 6. Signals are outputted from the internal circuit 7 to the electrode pads 9 through the signal lines 8.

A signal line region indicated by 10 is a region occupied by the signal lines 8 on the semiconductor chip of the semiconductor device 1 whose signal lines connect the internal circuit 7 and the electrode pads 9 electrically with each other. FIG. 1 shows a case where the signal line region 10 extends from the element region 6 where the internal circuit 7 is formed, then through the element isolation region 5 and further up to a part of the element region 4.

A comparison will now be made between FIG. 1 and FIG. 17 referred to at the beginning of this detailed description of the invention. Assuming that the size from the chip end to the element region 6 in FIG. 1 and the size from the chip end to the element region 116 (the size in the vertical direction shown in each of FIGS. 1 and 17) are almost uniform, the size of the signal line region 10 occupied by the signal lines 8 is larger than that of the signal line region 112 occupied by the signal lines 111. In other words, the number of the signal lines 8 shown in FIG. 1 is larger than that of the signal lines 111 shown in FIG. 17. This indicates that in the semiconductor device 1 shown in FIG. 1 the number of the signal lines 8 can be increased without enlarging the chip area thereof.

Figure 2:
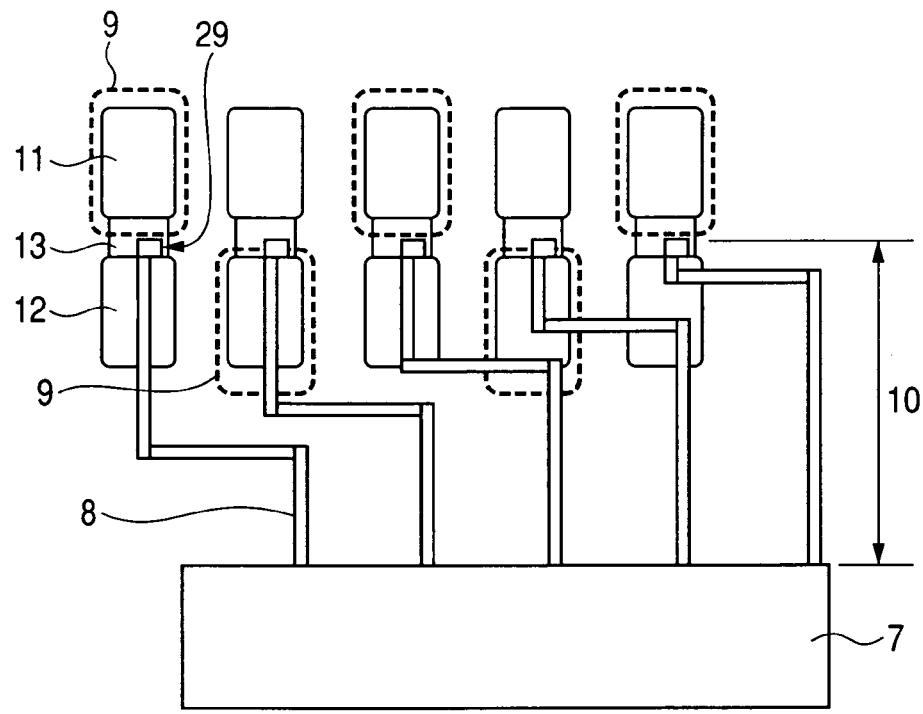
FIG. 2 is a plan view showing schematically a connection between an internal circuit and protective elements in the semiconductor device of the first embodiment.

FIG. 2 is a plan view showing schematically a connection of principal portions in the semiconductor device 1 shown in FIG. 1, also showing electrode pads 9 in a see-through state.

Figure 3:
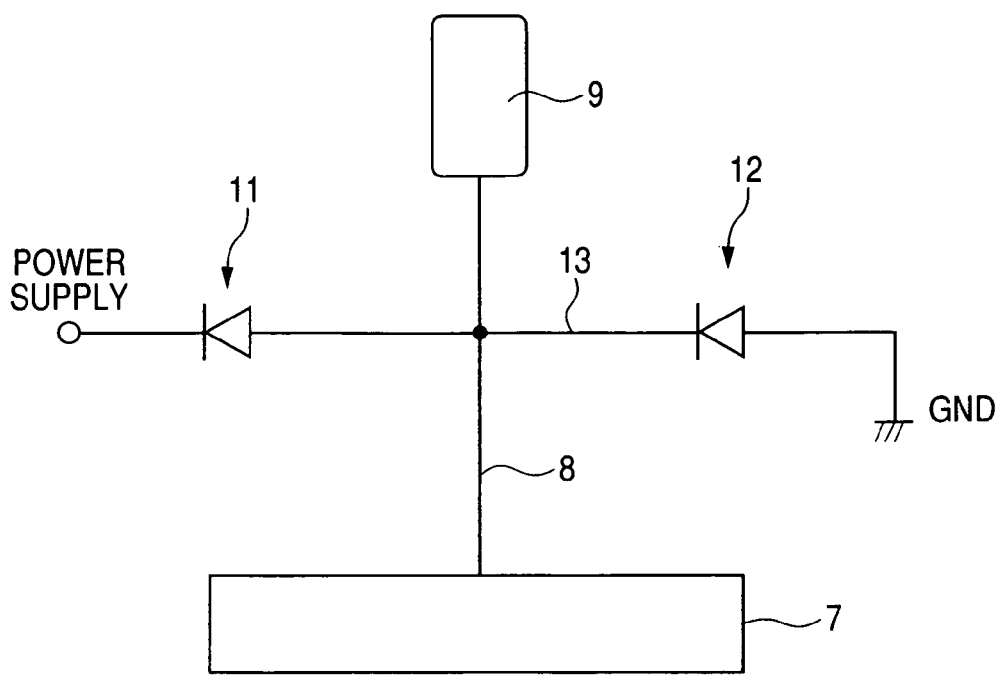
FIG. 3 is a connection diagram of the connection between the internal circuit and the protective elements in the semiconductor device shown in FIG. 2.

The numeral 11 denotes a protective element formed in the element region 3 shown in FIG. 1 and the numeral 12 denotes a protective element formed in the element region 4 shown in FIG. 1. The numeral 13 denotes a wiring line for connecting the protective elements 11 and 12 electrically with each other. As shown in FIG. 2, signal lines 8 are each electrically connected at one end thereof to the internal circuit 7 and at an opposite end thereof to an outlet port 29. FIG. 3 is a connection diagram showing a connection of principal portions in the semiconductor device 1 shown in FIG. 2. FIG. 3 shows a case of using, for example, diodes as the protective elements 11 and 12.

As shown in FIG. 3, the internal circuit 7 and the electrode pads 9 are connected together electrically and signals from the internal circuit 7 are outputted to the electrode pads 9 for output through signal lines 8. Protective elements 11 and 12 for protecting the internal circuit 7 from electrostatic breakdown, which are electrically connected between the internal circuit 7 and each electrode pad 9, are electrically connected to a power supply side and GND side, respectively.

A comparison will now be made between FIG. 2 and FIG. 18 referred to earlier. The signal line region 10 occupied by the signal lines 8 is shown in FIG. 2, while in FIG. 18 there is shown the signal line region 112 occupied by the signal lines 111. In FIG. 18, the signal lines 111 extending from the internal circuit 108 are connected to the internal circuit 108 side of the protective elements 118 and therefore the signal line region 112 occupied by the signal lines 111 passes over neither the protective elements 118 nor the protective elements 119. On the other hand, in FIG. 2, the signal lines 8 extending from the internal circuit 7 are each connected to the wiring line 13 located between the associated protective elements 11 and 12 and therefore the signal line region 10 occupied by the signal lines 8 passes over the protective elements 12. By providing the signal line region 10 over the protective elements 12 it is possible to increase the number of signal lines 8 without enlarging the chip area of the semiconductor device 1, as described above in connection with FIG. 1.

Thus, since the signal lines 8 for electric connection between the protective elements 11, 12 and the internal circuit 7 are drawn out from the wiring lines 13 located between the protective elements 11 and 12, it becomes possible to dispose the signal lines 8 over the protecting elements 12, so that the chip area need not be increased even if the number of signal lines increases. That is, since the signal line region 10 occupied by the signal lines 8 is provided over the protective elements 12, it is not necessary to increase the chip area.

Therefore, the wiring region on the main surface of the semiconductor chip, especially the signal line region occupied within the semiconductor chip main surface of the LCD driver having a multi-output structure, can be diminished by the application of the present invention on condition that the number of signal lines is the same.

Figure 4:
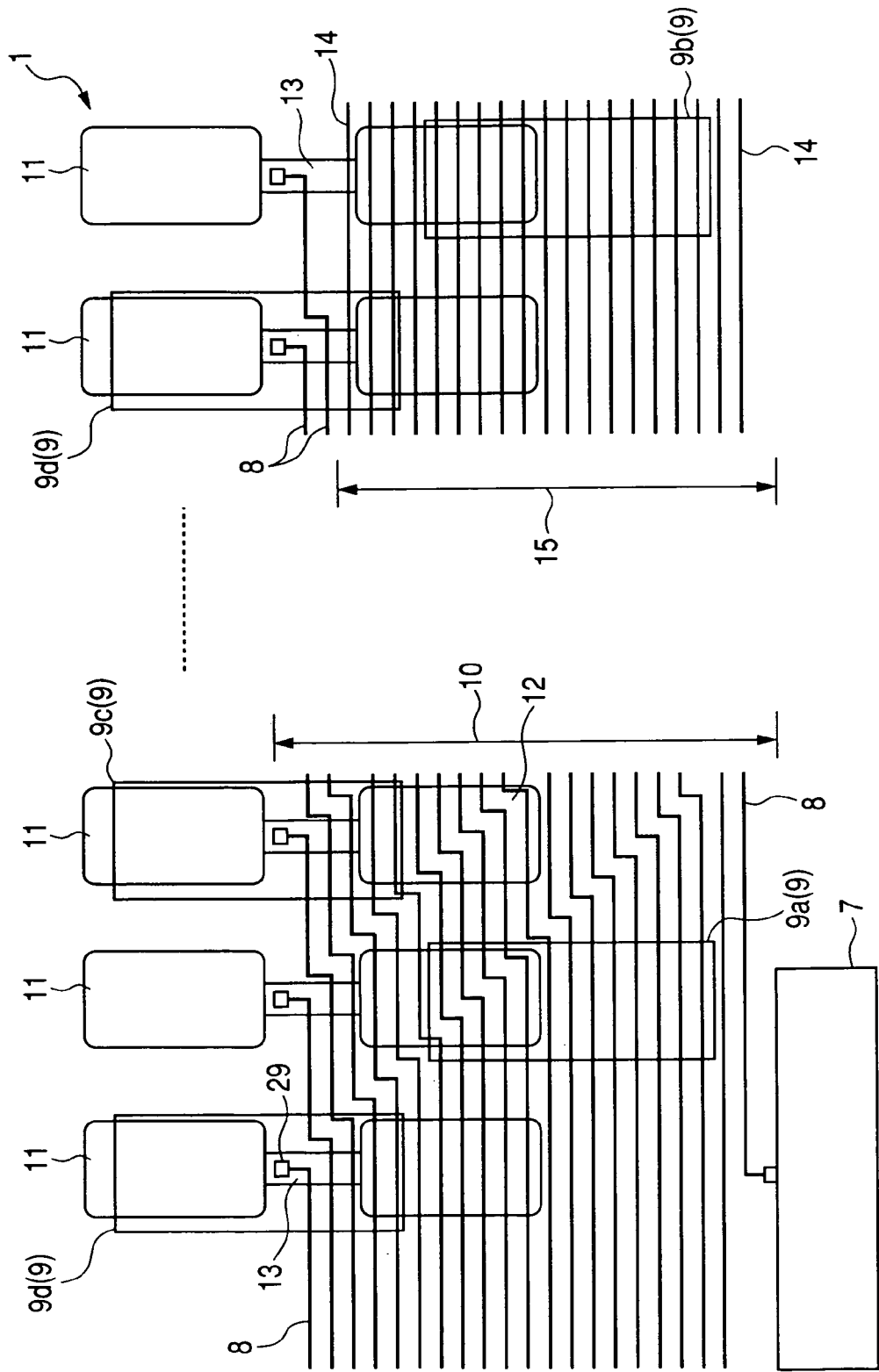
FIG. 4 is a plan view showing schematically a principal portion of the semiconductor device in FIG. 1.

The following description is now provided about the portion which underlies the electrode pads 9 in the semiconductor device 1 of this embodiment. FIG. 4 is a plan view showing schematically a principal portion of the semiconductor device 1 shown in FIG. 1, with electrode pads 9 being shown in a see-through state.

The numerals 9a and 9b in FIG. 4 denote electrode pads positioned inside (below in the vertical direction in FIG. 4) the electrode pads which are arranged in zigzags in two rows along a chip end side of the semiconductor device 1. The electrode pads 9a and 9b are for output of signals from the internal circuit 7. On the other hand, the numerals 9c and 9d denote electrode pads positioned outside (above in the vertical direction in FIG. 4) the electrode pads which are arranged in zigzags in two rows along a chip end side of the semiconductor device 1. The electrode pads 9c and 9d are also disposed for output of signals from the internal circuit 7. Signal lines 8 are arranged stepwise from the internal circuit 7 to the outlet ports 29 referred to above. This is because the wiring pitch in the internal circuit 7 and the spacing between adjacent electrode pads 9 are different from each other and the latter is the larger.

The numeral 14 denotes a dummy line connected electrically to none of the internal circuit 7 and protective elements 11, 12. In FIG. 4, the dummy lines 14 underlie the electrode pads 9b and 9d. Under the electrode pads 9 located in a peripheral edge portion of the semiconductor device 1 as the LCD driver the number of signal lines 8 is smaller than in the central portion of the LCD driver, so that the wiring occupancy under the electrode pads 9 located in the peripheral edge portion becomes low. Therefore, the dummy lines 14 are disposed to make the wiring occupancy uniform.

The region indicated by 15 represents a dummy line region occupied by the dummy lines 14 on the semiconductor chip of the semiconductor device 1. A comparison between the signal line region 10 and the dummy line region 15 shows that the number of the dummy lines 14 in the signal line region 10 is larger than that of the dummy lines 14 in the dummy line region 15. In other words, the number of the dummy lines disposed in a peripheral edge portion (the right side in FIG. 4) of the LCD driver 104 is larger than that of the dummy lines 14 disposed in the central portion (the left side in FIG. 4) of the LCD driver 104.

Power supply and GND lines for the internal circuit 7, etc. are disposed under the electrode pads 9c and 9d, but are not shown in the drawings because a description is here directed to the signal lines 8 and dummy lines 14 underlying the electrode pads 9a and 9b respectively.

As described above, the signal lines 8 for electric connection of the protective elements 11 and 12 to the internal circuit 7 are drawn out from the outlet ports 29 on the wiring lines 13 formed between the protective elements 11 and 12, whereby the signal lines 8 can be disposed over the protective elements 12. Consequently, plural signal lines 8 are present under the electrode pads 9a. In this case, by making uniform the wiring occupancies of the signal lines disposed under the electrode pads 9a, it is possible to make the upper surfaces of the electrode pads 9a nearly flush with one another, that is, the flatness of the upper surfaces of the electrode pads 9a can be improved. Moreover, by making the upper surfaces of the electrode pads 9a nearly flush with one another, it is possible to make the tops of bumps joined thereto nearly flush with one another.

In this embodiment, when it is described that the wiring occupancies are nearly equal, the range within 10%, more preferably the range within 5%, is recognized as an error in the manufacturing process and it is expressed that the wiring occupancies are uniform. The wiring lines under each electrode pad 9 are formed so that the wiring occupancy thereof is 50% or more under each electrode pad and in each wiring layer.

Dummy lines 14 are formed to make uniform the wiring occupancies in the regions under the electrode pads 9. Thus, plural dummy lines 14 are present under the electrode pads 9b and therefore, by making uniform the wiring occupancies of the wiring lines disposed under the electrode pads 9b, it is possible to make the upper surfaces of the electrode pads 9b nearly flush with one another. Moreover, by making the upper surfaces of the electrode pads 9b nearly flush with one another, it is possible to make the tops of bumps joined thereto nearly flush with one another. The dummy lines 14 disposed for making uniform the wiring occupancies in the regions under the electrode pads 9 may be supplemented as in the regions under the electrode pads 9d.

Thus, since the upper surfaces of the electrode pads 9 formed on the semiconductor chip of the semiconductor device 1 are superior in flatness, the bumps formed respectively on plural electrode pads 9 (9a to 9d) and a package of the semiconductor chip can be connected together through the bumps in a satisfactory manner without causing any inconvenience.

Figure 5:
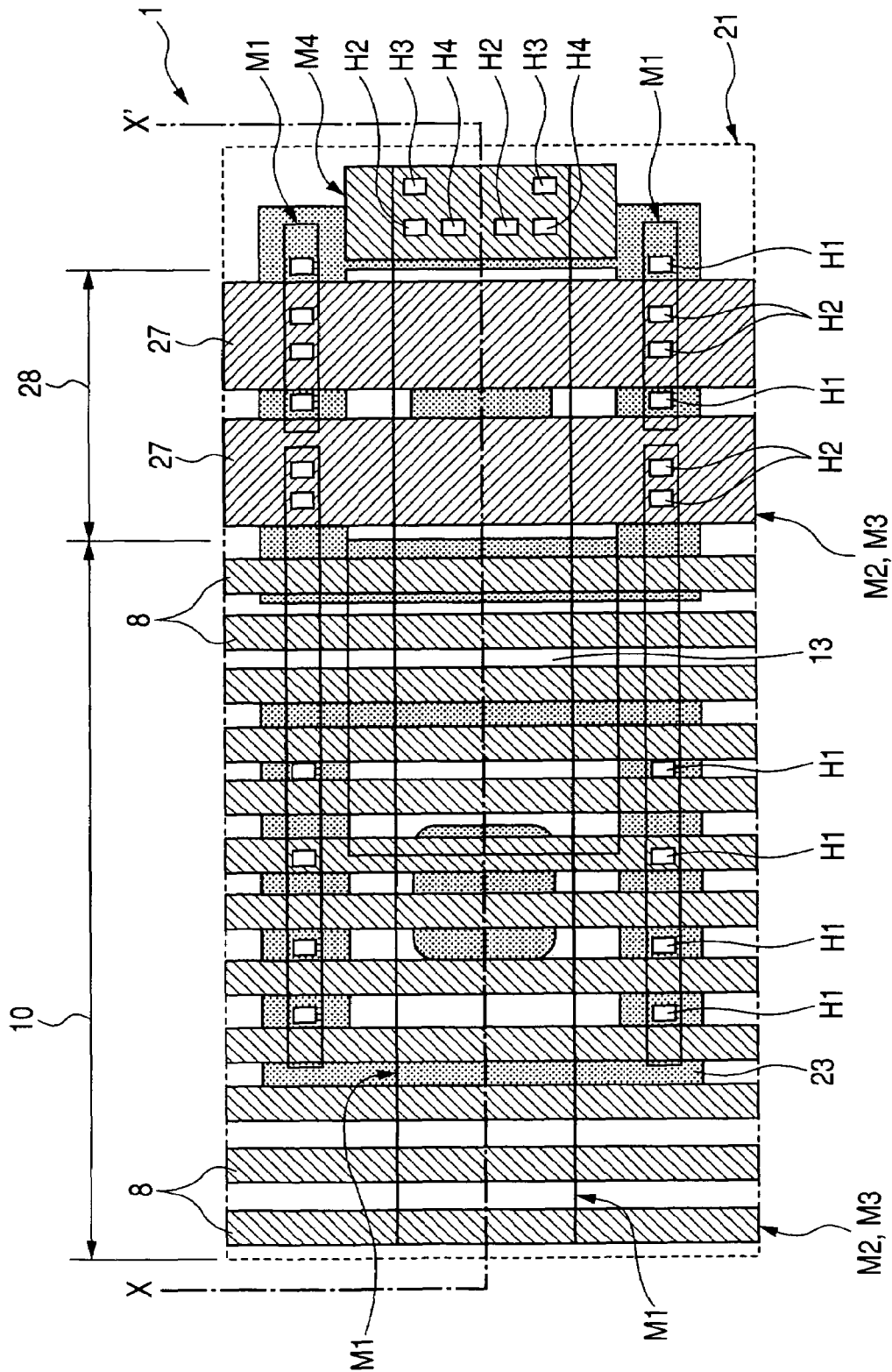
FIG. 5 is a plan view showing schematically a principal portion of the semiconductor device in FIG. 4.
Figure 6:
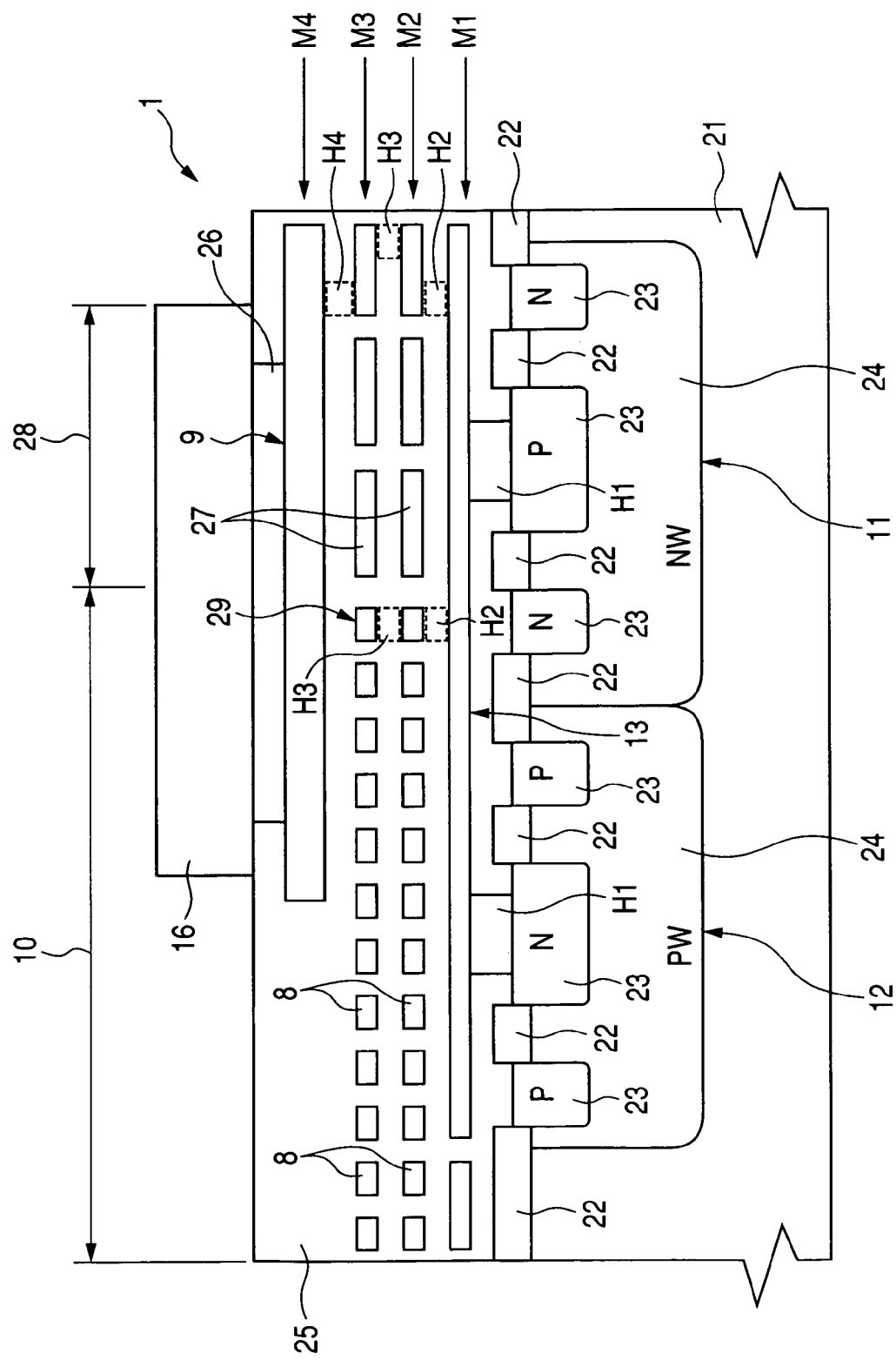
FIG. 6 is a sectional view taken on line X-X' in FIG. 5.

Next, a description will be given about the structure of a principal portion of the semiconductor device 1 according to this embodiment. FIG. 5 is a plan view showing schematically a principal portion of the semiconductor device 1 in FIG. 4, more specifically, showing the vicinity of electrode pads 9 located outside (above in the vertical direction in FIG. 4) the electrode pads which are arranged in zigzags in two rows along a chip end side. FIG. 6 is a sectional view taken on line X-X' in FIG. 5. In FIG. 5, for showing a layout relation among wiring layers M1 to M4, the wiring layers M1 and M4 are not hatched, but the wiring layers M2 and M3 are hatched. In FIG. 5, a diffusion layer 23 is also hatched. Further, a bump 16 shown in FIG. 6 is not shown in FIG. 5. However, under the bump 16 there are formed wiring layers M1 to M4 and desired semiconductor elements (e.g., pn junction diodes as protective elements 11 and 12).

A semiconductor substrate 21 is constituted for example by a single silicon (Si) crystal of p type and on a device-forming surface in its main surface there are formed element isolation regions 22 and diffusion layers 23 adjacent thereto. The element isolation regions 22 are each constituted by a silicon oxide (e.g., $SiO_2$) film formed for example by LOCOS (Local Oxidization of Silicon) method. The element isolation regions 22 may be formed in a groove or trench shape (SGI: Shallow Groove Isolation or STI: Shallow Trench Isolation).

On the main surface of the semiconductor substrate 21 there are formed an internal circuit (not shown) including MIS transistor for example, as well as protective elements 11 and 12 constituted by pn junction diodes for example. The pn junction diodes as the protective elements 11 and 12 are for the prevention of electrostatic breakdown and are formed by pn junction between n- or p-type wells 24 of the semiconductor substrate 21 and overlying p- or n-type diffusion layers 23.

Over the internal circuit and the protective elements 11 and 12 there are formed wiring layers M1 to M4 which are mutually insulated and separated by an interlayer insulating film 25. The wiring layers M1 to M4 are formed, for example, using aluminum (or aluminum alloy) as a main component, but may be wiring layers of a damascene structure formed using copper (or copper alloy as a main component. The wiring layers of a damascene structure are each formed by embedding an electrically conductive film containing copper as a main component into a groove formed within an interlayer film disposed between adjacent wiring layers.

The wiring layer M1 is electrically connected through contact holes H1 to the internal circuit and the protective elements 11, 12 which underlie the wiring layer M1. The wiring layer M2 is electrically connected to the wiring layer M1 through contact holes H2. The wiring layer M3 is electrically connected to the wiring layer M2 through contact holes H3. Further, the wiring layer M4 is electrically connected to the wiring layer M3 through contact holes H4.

The electrode pads 9 are constituted by the wiring layer M4. Likewise, the wiring lines 8 are constituted by the wiring layers M2 and M3. Further, the wiring lines 13 are constituted by the wiring layer M1. Bumps 16 are joined to the wiring layer M4 through a metallic base film 26 formed on the wiring layer M4 (electrode pads 9). The metallic base film 26 has a function of improving the adhesion of the bumps 16 to the electrode pads 9 and the interlayer insulating film 25. For example, the metallic base film 26 is constituted by a single high melting metal film such as a film of titanium (Ti) or titanium-tungsten (TiW) or a laminate film having a nickel (Ni) film and a gold (Au) film laminated in this order from below to above onto a titanium film. The bumps 16 are formed, for example, by plating method using gold (Au).

As shown in FIGS. 5 and 6, the semiconductor device 1 includes a signal line region 10 occupied by the signal lines 8 on the main surface of the semiconductor substrate 21 and a power line region 28 occupied by power lines 27 on the main surface.

The signal lines 8 and the power lines 27 are constituted by the wiring layers M2 and M3. The electrode pads 9 connected electrically to the bumps 16 as external output terminals are constituted by the wiring layer M4 which overlies the wiring layer M3. Further, the wiring lines 13 which connect the protective elements 11 and 12 electrically with each other are constituted by the wiring layer M1 which underlies the wiring layer M2.

The signal lines 8 extending from the internal circuit formed on the main surface of the semiconductor device 1 pass over the protective elements 12 and are connected electrically to the wiring lines 13 through contact holes H2 and H3 in the outlet ports 29 formed on the wiring lines 13. Further, the wiring lines 13 are electrically connected to the electrode pads 9 through contact holes H2, H3 and H4. Signals from the internal circuit are outputted to the exterior through these connections.

On the other hand, to prevent breakdown of the internal circuit caused for example by static electricity exerted on the internal circuit from the exterior, for example to prevent breakdown of the gate insulating film of MIS transistor, the protective elements 11 and 12 are connected electrically between the internal circuit and the electrode pads 9.

As shown in FIG. 6, the outlet port 29 for drawing out each signal line 8 from the associated protective elements 11 and 12 is provided on the wiring line 13 positioned approximately between the protective elements 11 and 12. Thus, a region capable of being used as the signal line region 10 is constituted over the region where the protective elements 11 and 12 are formed. According to the prior art, for example in case of providing the outlet port 29 of each signal line 8 on the wiring line 13 located on the internal circuit side (the left side in the transverse direction in FIG. 6), the signal line 8 is not provided over the protective element 11 in connection with the signal line region 10. However, in a semiconductor device wherein a multitude of outputs are developed from internal circuits like an LCD driver, an increase in size of the signal line region 10 caused by an increase in the number of signal lines exerts a greater influence on the chip area. Therefore, by adopting the structure wherein the outlet port 29 for drawing out each signal line from the associated protective elements 11 and 12 is provided on the wiring line positioned approximately between both protective elements, it becomes possible to dispose the signal line 8 over the protective element 12 and further over the protective element 11 which region has heretofore not been used as the signal line region 10. Consequently, it is possible to prevent an increase of the chip area even if the signal line region 10 becomes larger. In other words, by providing the signal line outlet port 29 from the protective elements 11 and 12 on the wiring line 13 positioned approximately between both protective elements, it becomes possible to dispose the signal lines 8 also in the region underlying the electrode pads 9 which region has heretofore not been used as the signal line region 10, so that an increase of the chip area can be prevented even if the signal line region 10 becomes larger. Further, in case of disposing the signal lines 8 under the electrode pads 9, the upper surfaces of the electrode pads 9 can be made approximately flush with one another, that is, can be improved in their flatness, by making uniform the wiring occupancies of the wiring lines disposed under the electrode pads 9. Besides, by making the upper surfaces of the electrode pads 9 approximately flush with one another, it is possible to make the tops of bumps 16 joined thereto approximately flush with one another.

Next, the following description is provided about an example of a manufacturing process for the semiconductor device. FIGS. 7 to 11 are plan views showing schematically a principal portion of the semiconductor device in the manufacturing process. The sectional view of FIG. 6 taken on line X-X' in FIG. 5 corresponds to sectional views taken on line X-X' in FIG. 7 to 11.

First, as shown in FIG. 6, element isolation regions 22 are formed by for example LOCOS method on the main surface of the semiconductor substrate 21 which constitutes a semiconductor wafer having a generally circular shape in plan, followed by formation of an internal circuit (not shown) and protective elements 11 and 12.

Subsequently, an insulating film is deposited on the main surface of the semiconductor substrate 21 by CVD (Chemical Vapor Deposition) and then contact holes H1 are formed in predetermined positions of the insulating film by the photolithography or dry etching technique.

Figure 7:
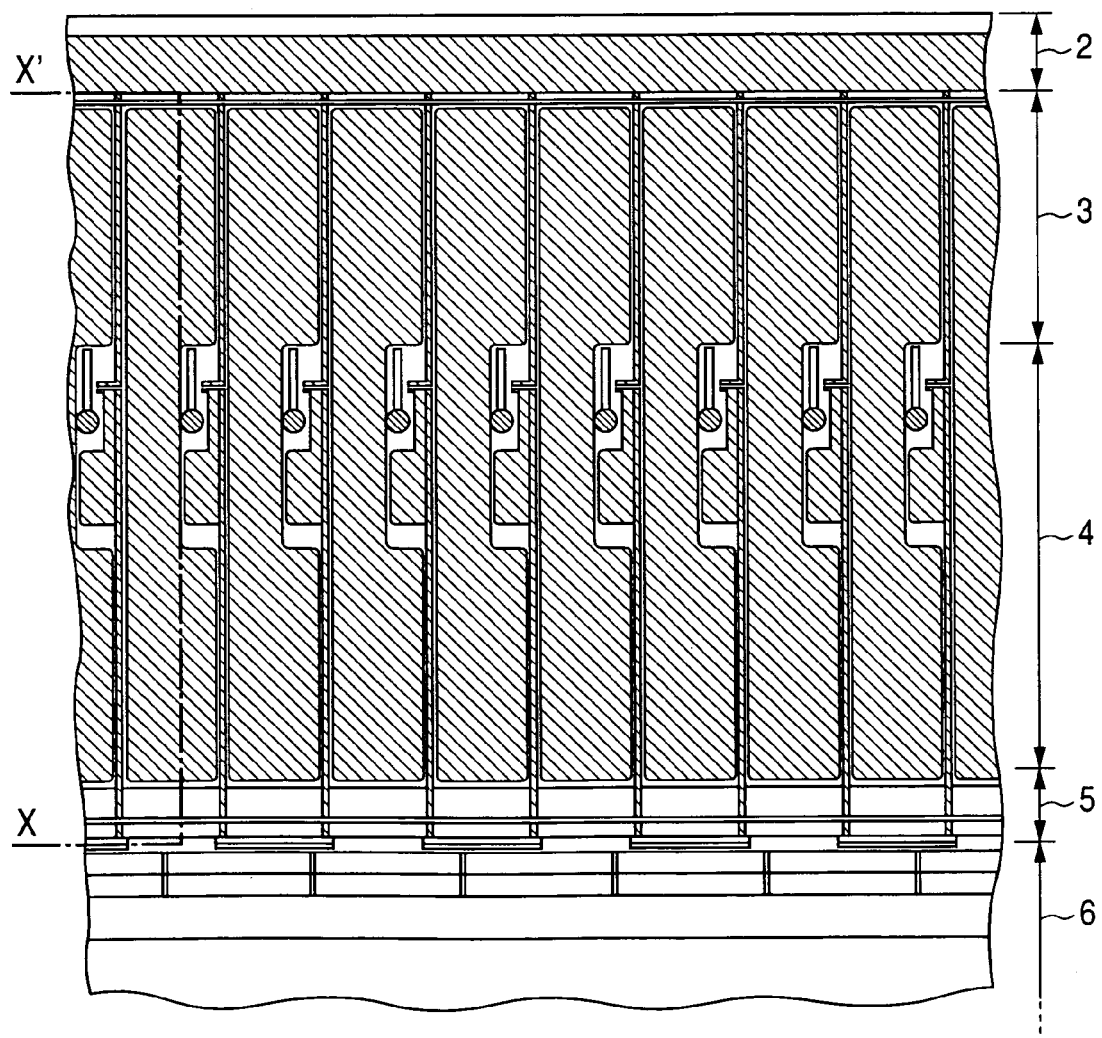
FIG. 7 is a plan view showing schematically a principal portion of the semiconductor device in a manufacturing process for the semiconductor device according to the first embodiment.

Subsequently, for example, titanium nitride film, titanium film, aluminum film and titanium nitride film are deposited in this order from below to above onto the insulating film by sputtering for example. The thus-laminated metallic film is then subjected to patterning by the photolithography or dry etching technique to form a wiring layer M1. FIG. 7 is a plan view showing the wiring layer M1 schematically. That is, the wiring layer M1 which passes over the protective elements 11 and 12 is formed in the element regions 3 and 4.

Figure 8:
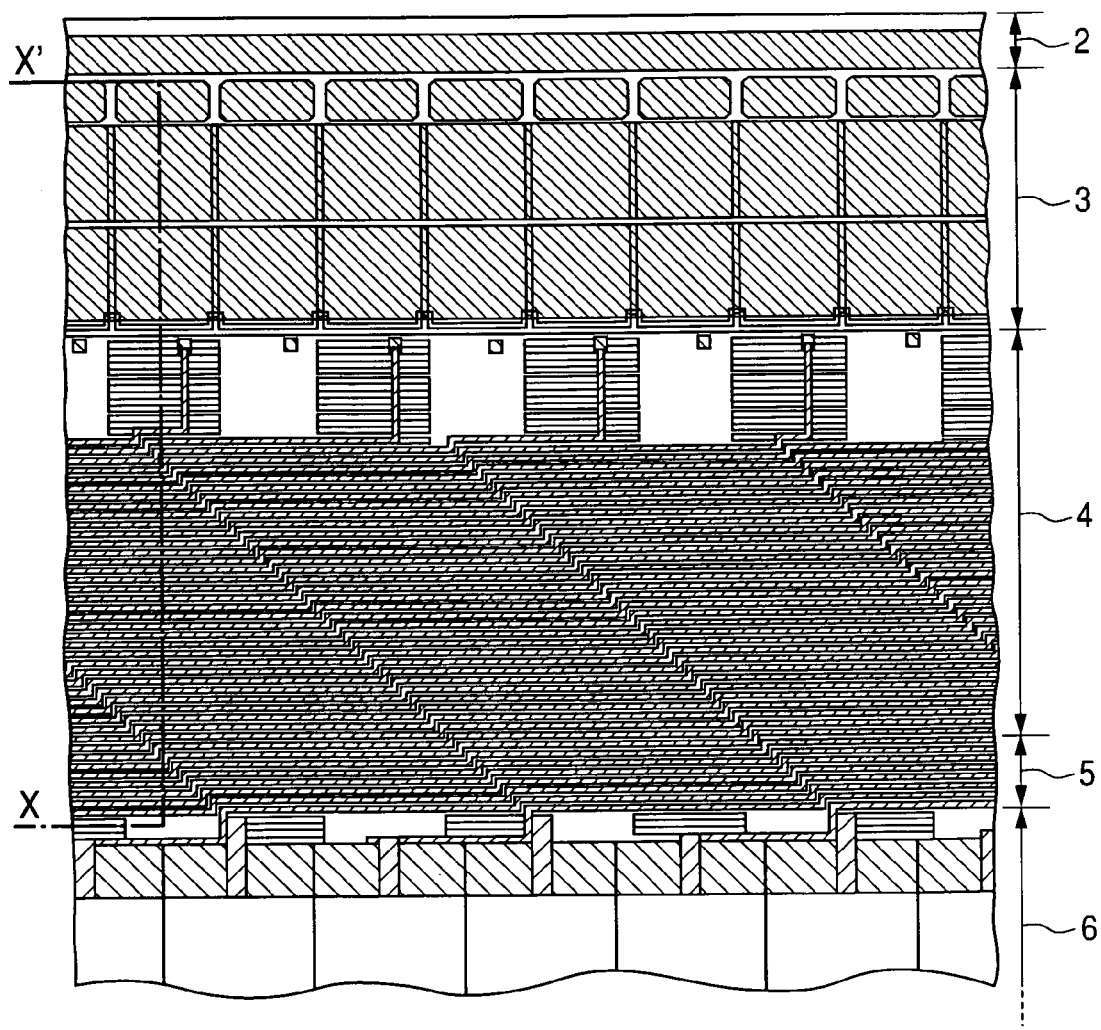
FIG. 8 is a plan view showing schematically the principal portion of the semiconductor device in the manufacturing process for the semiconductor device according to the first embodiment.

Likewise, contact holes H2 are then formed in the interlayer insulating film 25 and a wiring layer M2 is formed on the interlayer insulating film 25. FIG. 8 is a plan view showing the wiring layer M2 schematically. That is, power lines 27 passing over the protective element 11 are formed in the element region 3, while signal lines 8 passing over the protective element 12 are formed in the element regions 4 and 5. As described above in connection with FIG. 4, the signal lines 8 are arranged stepwise from the internal circuit 7 toward the outlet ports 29. As the case may be, dummy lines 14 are formed as described above in connection with FIG. 4.

Figure 9:
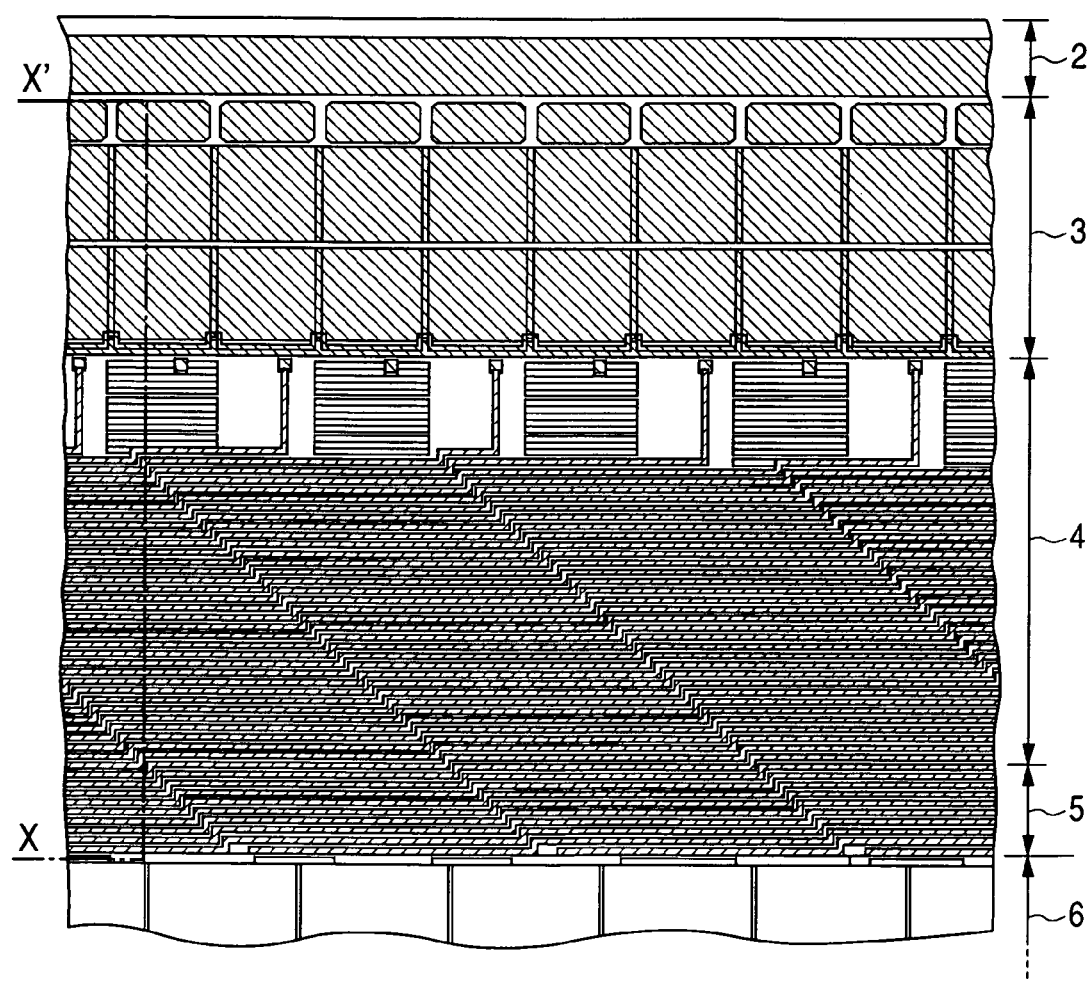
FIG. 9 is a plan view showing schematically the principal portion of the semiconductor device in the manufacturing process for the semiconductor device according to the first embodiment.

Likewise, contact holes H4 are then formed in the interlayer insulating film 25 and a wiring layer M3 is formed on the interlayer insulating film 25. FIG. 9 is a plan view showing the wiring layer M3 schematically. That is, power lines 27 passing over the protective element 11 are formed in the element region 3, while signal lines 8 passing over the protective element 12 are formed in the element regions 4 and 5. As described above in connection with FIG. 4, the signal lines 8 are arranged stepwise from the internal circuit 7 toward the outlet ports 29. As the case may be, dummy lines 14 are formed as described above in connection with FIG. 4.

Figure 10:
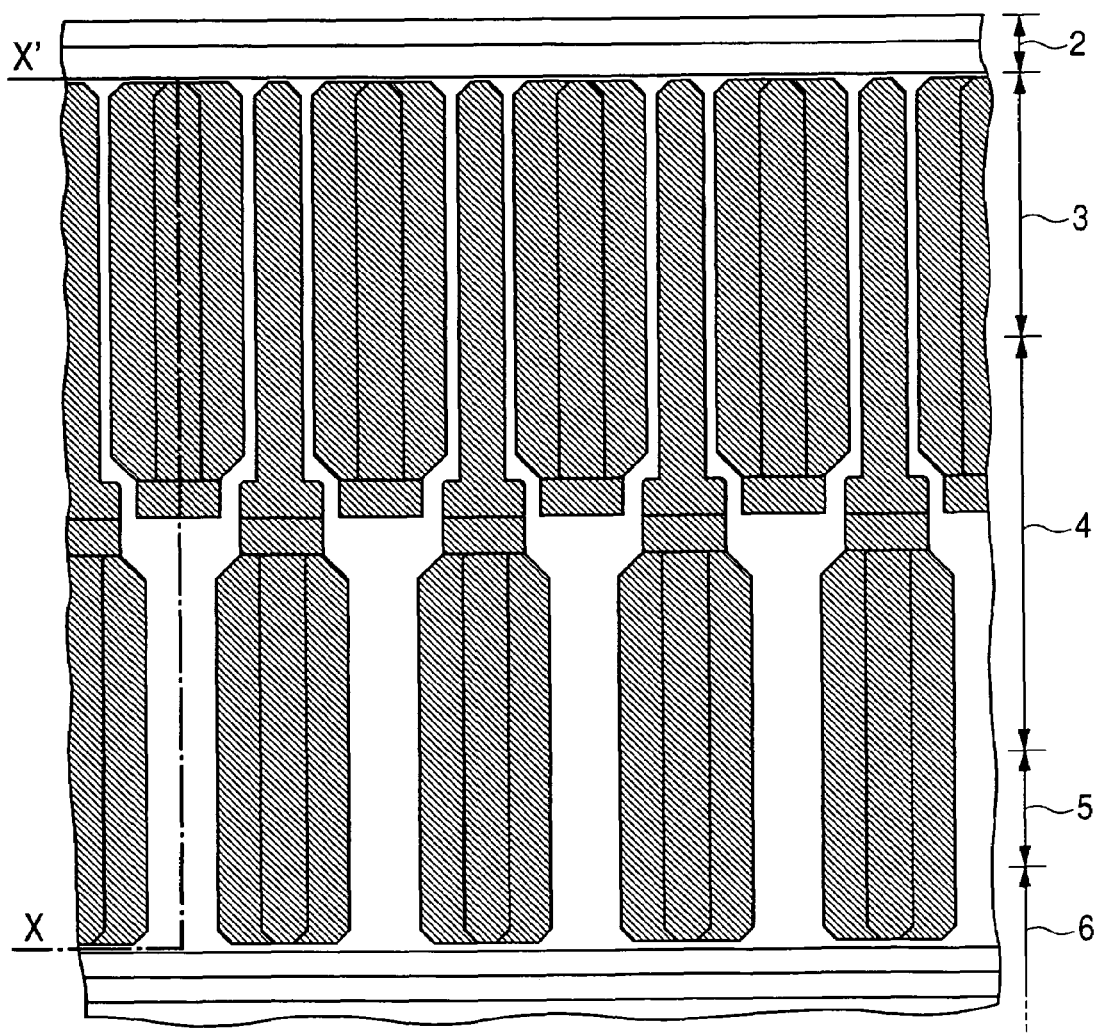
FIG. 10 is a plan view showing schematically the principal portion of the semiconductor device in the manufacturing process for the semiconductor device according to the first embodiment.

Likewise, contact holes H4 are then formed in the interlayer insulating film 25 and a wiring layer M4 is formed on the interlayer insulating film 25. FIG. 10 is a plan view showing the wiring layer M4 schematically. That is, the wiring layer M4 which includes electrode pads 9 is formed in the element regions 3, 4 and the element isolation region 5. The wiring layers M1 to M3 and the protective elements 11 and 12 as semiconductor elements underlie the electrode pads 9 and the wiring occupancies under the electrode pads 9 in the wiring layers M1 to M3 are equal. The wiring lines are formed so as to be equal in wiring occupancy under each electrode pad 9.

Figure 11:
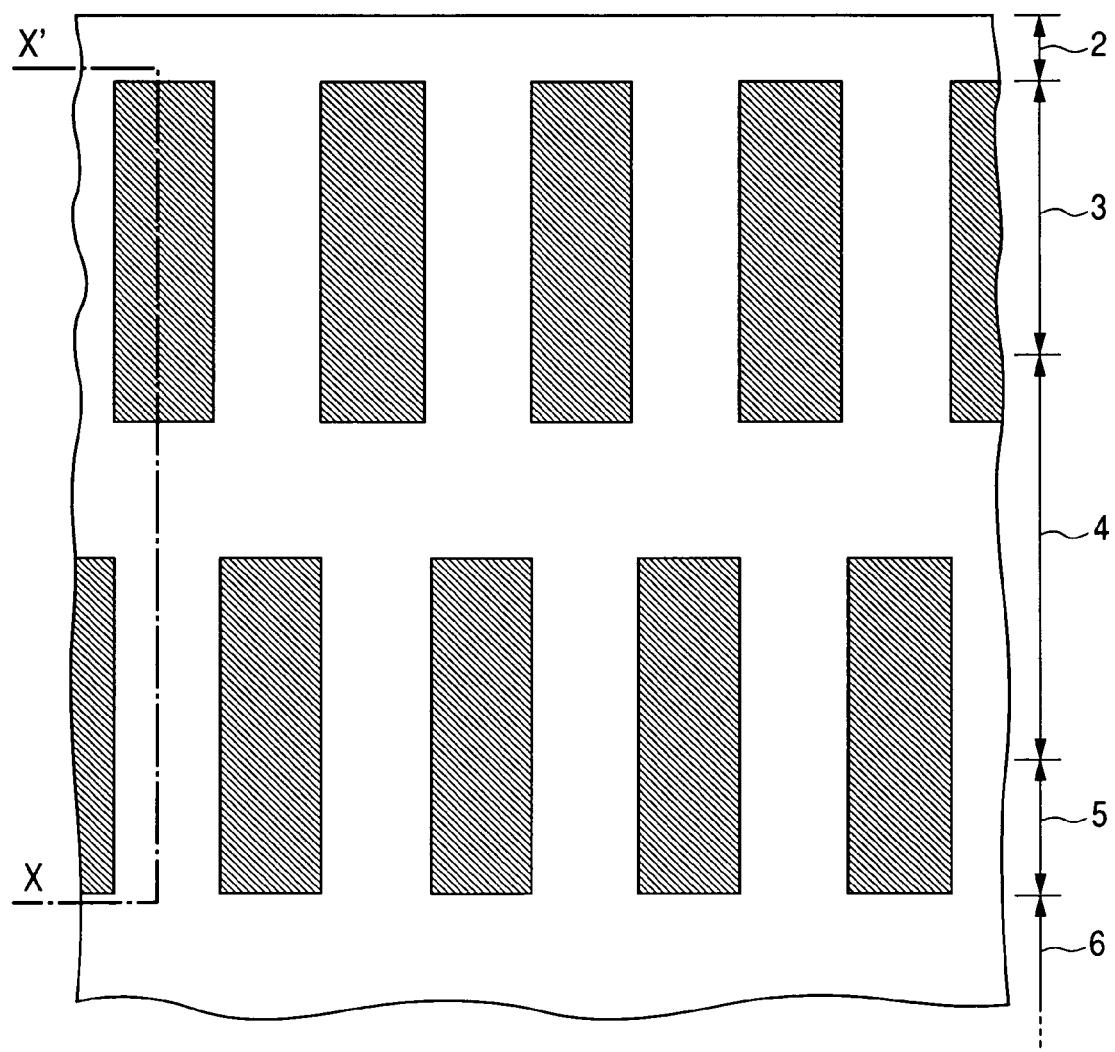
FIG. 11 is a plan view showing schematically the principal portion of the semiconductor device in the manufacturing process for the semiconductor device according to the first embodiment.

Subsequently, an interlayer insulating film 25 for surface protection is deposited, then there are formed apertures to which the wiring layer M4 is partially exposed, and electrode pads 9 are formed. FIG. 11 is a plan view showing the electrode pads schematically.

Next, a conductor film such as a single high melting metallic film, e.g., titanium or titanium-tungsten film, or a laminate film formed by laminating a nickel film and a gold film in this order from below to above onto a titanium film is deposited onto the interlayer insulating film 25 by sputtering for example and a photoresist pattern is formed on the conductor film to expose the bump-forming region and cover the other region.

Then, bumps 16 are formed by plating using gold for example, followed by removal of the photoresist pattern and subsequent removal of the conductor film as a base film by etching, to form a metallic base film 26. In this way there is completed the semiconductor device 1 having bumps 16 on the electrode pads 9.

Second Embodiment

In the previous first embodiment, as shown in FIG. 2, the outlet ports 29 for the signal lines 8 are provided between the protective elements 11 and 12 in the semiconductor device having electrode pads 9 arranged in zigzags in two rows along a chip end side. In this second embodiment, a description will be given about a semiconductor device wherein outlet ports for the signal lines 8 are formed on a chip end side.

Figure 12:
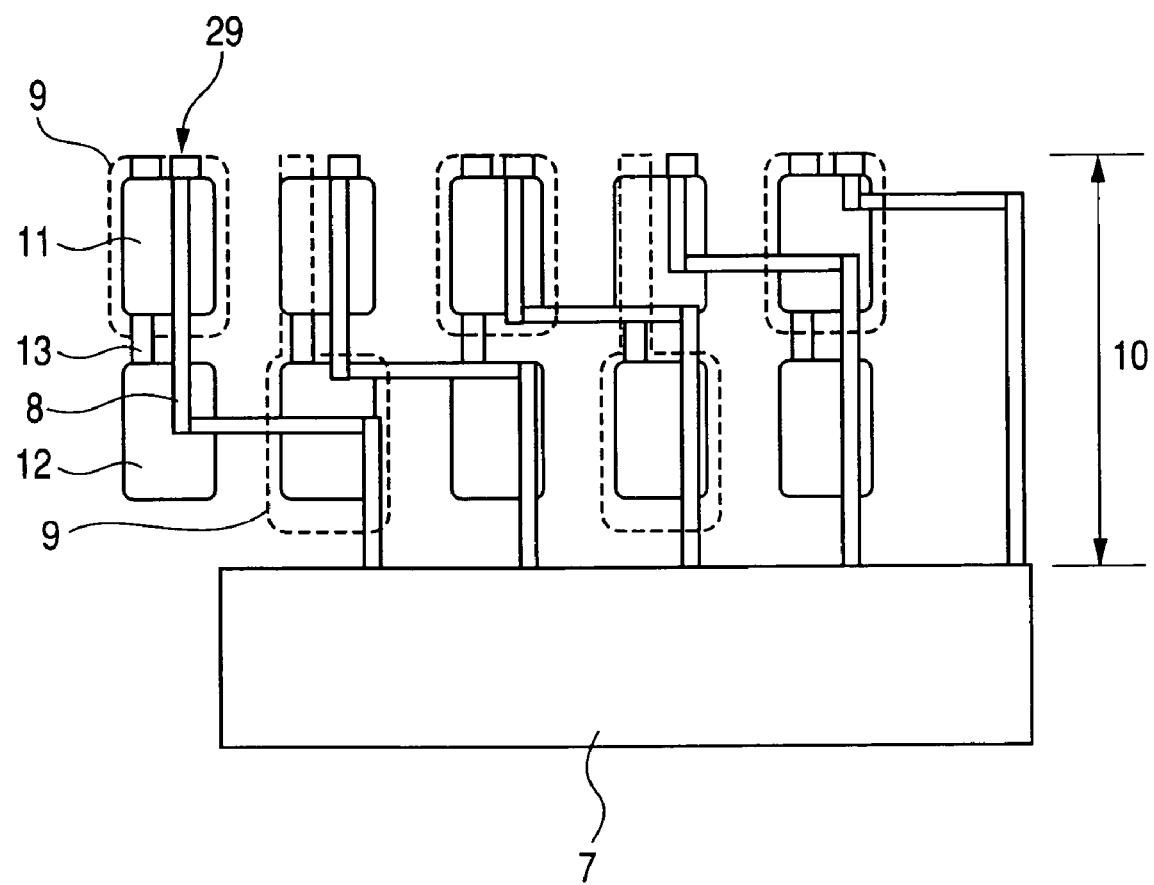
FIG. 12 is a plan view showing schematically a connection between an internal circuit and protective elements in a semiconductor device according to a second embodiment of the present invention.

FIG. 12 is a plan view showing schematically a connection of principal portions in the semiconductor device according to this second embodiment, in which electrode pads 9 are shown in a see-through state.

As shown in FIG. 12, outlet ports 29 for signal lines 8 which provide electric connections from protective elements 11 and 12 to an internal circuit 7 are formed on a chip end side (the upper side in the vertical direction in FIG. 12) of the protective elements 11, whereby the signal lines 8 can be disposed over the protective elements 12 and further over the protective elements 12. Therefore, the chip area need not be enlarged even if the number of signal lines increases. More particularly, since a signal line region 10 as a region occupied by the signal lines 8 is provided over the protective elements 12, it is not necessary to enlarge the chip area.

Therefore, the wiring region on the main surface of the semiconductor chip, especially the signal line region occupied within the semiconductor chip main surface of the LCD driver having a multi-output structure, can be diminished by the application of the present invention on condition that the number of signal lines is the same.

Third Embodiment

In the previous first embodiment, as shown in FIG. 2, the outlet ports 29 for the signal lines 8 are provided between the protective elements 11 and 12 in the semiconductor device having electrode pads 9 which are arranged in zigzags in two rows along a chip end side. In this third embodiment, a description will be given below about a semiconductor device having electrode pads 9 which are arranged straight in one row along a chip end side.

Figure 13:
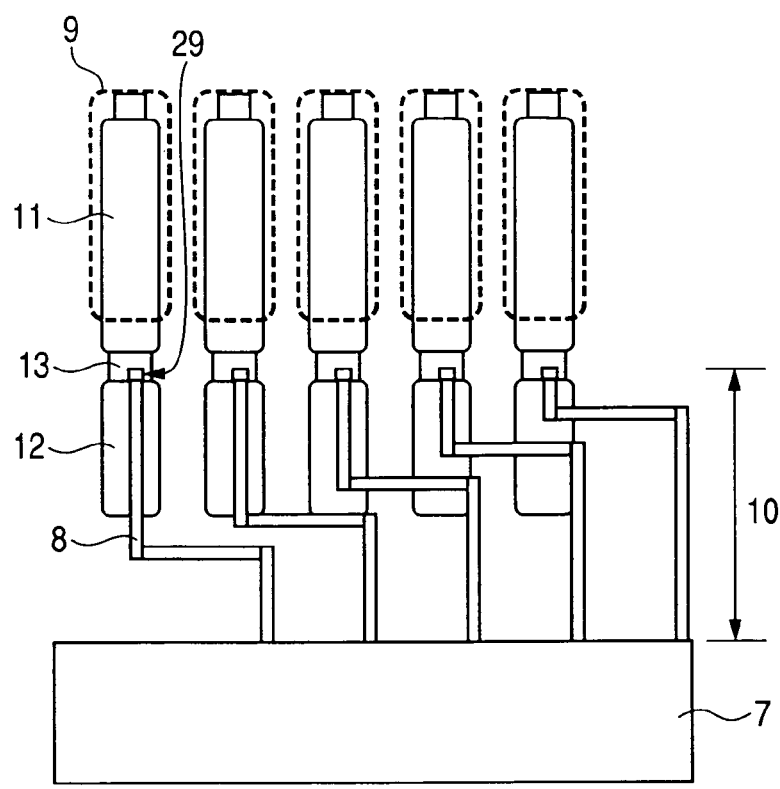
FIG. 13 is a plan view showing schematically a connection between an internal circuit and protective elements in a semiconductor device according to a third embodiment of the present invention.

FIG. 13 is a plan view showing schematically a connection of principal portions in the semiconductor device according to this third embodiment, in which electrode pads 9 are shown in a see-through state.

As shown in FIG. 13, even in case of a straight layout of electrode pads 9, signal lines 8 which provide electric connections from the protective elements 11 and 12 to an internal circuit 7 can be drawn out from outlet ports 29 formed on wiring lines 13 located between the protective elements 11 and 12 and can be disposed over the protective elements 12. Therefore, the chip area need not be enlarged even if the number of signal lines increases. More particularly, since a signal line region 10 as a region occupied by the signal lines 8 is provided over the protective elements 12, it is not necessary to enlarge the chip area.

Consequently, the wiring region on the main surface of the semiconductor chip, especially the signal line region occupied within the semiconductor chip main surface of the LCD driver having a multi-output structure, can be diminished by the application of the present invention on condition that the number of signal lines is the same.

Fourth Embodiment

In the previous third embodiment, as shown in FIG. 13, the outlet ports 29 for the signal lines 8 are provided between the protective elements 11 and 12 in the semiconductor device having electrode pads 9 arranged straight in one row along a chip end side. In this fourth embodiment, a description will be given below about a semiconductor device wherein outlet ports 29 for signal lines 8 are formed on a chip end side.

Figure 14:
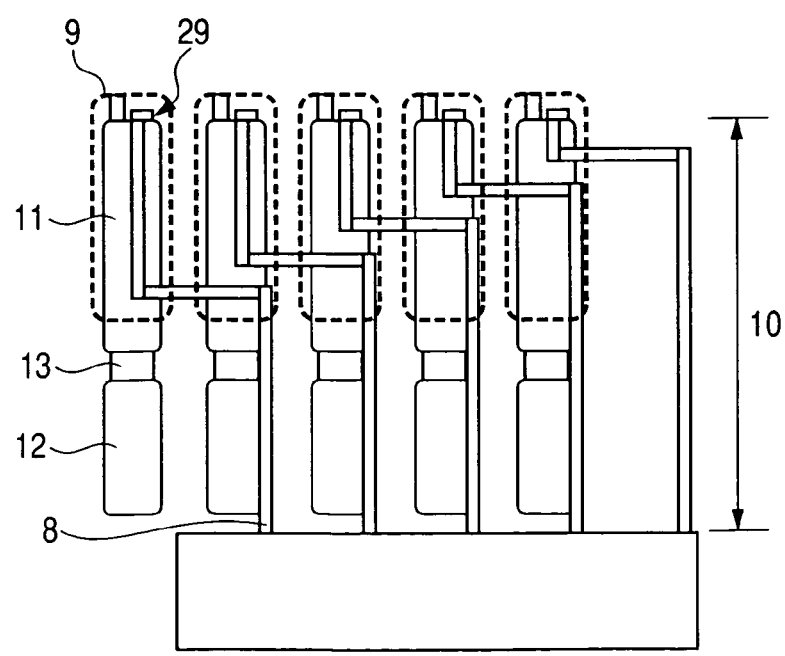
FIG. 14 is a plan view showing schematically a connection between an internal circuit and protective elements in a semiconductor device according to a fourth embodiment of the present invention.

FIG. 14 is a plan view showing schematically a connection of principal portions in the semiconductor device according to this fourth embodiment, in which electrode pads 9 are shown in a see-through state.

As shown in FIG. 14, outlet ports 29 for signal lines 8 which provide electric connections from protective elements 11 and 12 to an internal circuit 7 are formed on a chip end side (the upper side in the vertical direction in FIG. 14) of the protective elements 11, whereby the signal lines 8 can be disposed over the protective elements 12 and further over the protective elements 11. Therefore, the chip area need not be increased even if the number of signal lines increases. More particularly, since a signal line region 10 occupied by the signal lines 8 is provided over the protective elements 12, it is not necessary to increase the chip area.

Consequently, the wiring region on the main surface of the semiconductor chip, especially the signal line region occupied within the semiconductor chip main surface of the LCD driver having a multi-output structure, can be diminished by the application of the present invention on condition that the number of signal lines is the same.

Although the present invention has been described above concretely by way of embodiments thereof, it goes without saying that the present invention is not limited to the above embodiments, but that various changes may be made within the scope not departing from the gist of the invention.

Although in the above description the present invention is applied mainly to the LCD driver which belongs to the application field as a background of the present invention, no limitation is made thereto. For example, the present invention is also applicable to a semiconductor device having such a memory circuit as SRAM (Static Random Access Memory) or a flash memory (EEPROM; Electric Erasable Programmable Read Only Memory) or to a semiconductor device of a combination type having both memory circuit and logic circuit on one and same substrate.

Although the semiconductor device shown in the first embodiment is of a four-layer wiring structure, no limitation is made thereto, but the present invention is also applicable to a semiconductor device having a larger number of wiring layers.

Further, although in the first embodiment the dummy lines are electrically connected to none of internal circuits and protective elements, that is, the dummy lines are wholly dummy and are in a floating state, they may be formed by a portion of wiring lines in the internal circuits.

The present invention is widely utilizable in the semiconductor manufacturing industry.

What is claimed is:

1. A semiconductor device comprising:
a semiconductor substrate of a rectangular shape having a main surface;
a plurality of input electrode pads formed over said main surface along a first relatively long side of said semiconductor substrate;

a plurality of output electrode pads formed over said main surface along a second relatively long side of said semiconductor substrate, opposing to said first relatively long side;

an internal circuit formed over said main surface between said plurality of input electrode pads and said plurality of output electrode pads, said internal circuit providing predetermined output signals to said plurality of output electrode pads;

a plurality of protective elements for protecting said internal circuit from an electro-static breakdown formed over said main surface, said plurality of protective elements being electrically connected to said plurality of output electrode pads, respectively;

a plurality of signal wirings for providing said predetermined output signals to said plurality of output electrode pads, first ends of said plurality of signal wirings being connected to said internal circuit and the opposing, second ends of said plurality of signal wirings being connected to said plurality of protective elements, respectively; and a plurality of dummy wirings which are formed over said protective elements, which are formed under said output electrode pads and which are not connected to said protective elements and said internal circuit;

wherein each of said plurality of protective elements is formed over said main surface below a respective one of said plurality of output electrode pads, wherein each of the second ends of said plurality of signal wirings is electrically connected to the respective protective element of said plurality of protective elements over an area in which said plurality of protective elements are formed and below said plurality of output electrode pads, and wherein, in the direction in which said second relatively long side is extended, the number of said dummy wirings disposed in a peripheral edge portion of said semiconductor substrate is larger than the number of said dummy wirings disposed in a central portion of said semiconductor substrate.

2. A semiconductor device according to claim 1, wherein each of said plurality of protective elements includes a first protective element formed at the side of said second relatively long side and a second protective element formed at the side of said internal circuit.

3. A semiconductor device according to claim 2, wherein said first protective element is a PN-junction diode comprised of an N-type well and a P-type semiconductor layer formed in said N-type well, and
wherein said second protective element is a PN-junction diode comprised of a P-type well and an N-type semiconductor layer formed in said P-type well.

4. A semiconductor device according to claim 3, wherein a power supply voltage is provided to said N-type well, and
wherein a ground voltage is provided to said P-type well.

5. A semiconductor device according to claim 4, wherein said P-type semiconductor layer of said first protective element and said N-type semiconductor layer of said second protective element are commonly connected to each other by a first wiring layer formed over said first and second protective elements,
wherein said plurality of signal wirings are formed of a vertically higher level conductive layer than that of said first wiring layer with respect to the substrate surface, and
wherein each of the second ends of said plurality of signal wirings is electrically connected to said first wiring layer via an opening formed in an insulating film formed on said first wiring layer.

6. A semiconductor device according to claim 5, further comprising a second wiring layer connecting each of said plurality of output electrode pads with said first wiring layer,
wherein said second wiring layer is formed of a multiple layer which is formed of the same layers as said first wiring layer and said plurality of signal wirings, and
wherein said second wiring layer is arranged nearer to said second relatively long side than are the second ends of said signal wirings.

7. A semiconductor device according to claim 6, wherein said plurality of output electrode pads and said plurality of input electrode pads are formed of uppermost layer in a multiple wiring structure.

8. A semiconductor device according to claim 7, wherein said plurality of output electrode pads contain a first array of output electrode pads and a second array of output electrode pads, the first and second arrays are disposed in parallel along the second relatively long side of said semiconductor substrate, and the output electrode pads in the second array are respectively shifted relative to the positioning of the respective output electrode pads in the first array by an amount intermediate the spacing distance between adjacently disposed output electrode pads within the first array.

9. A semiconductor device according to claim 8, wherein said internal circuit is a liquid crystal display driving circuit.

10. A semiconductor device according to claim 1, wherein said plurality of output electrode pads and said plurality of input electrode pads are formed of uppermost layer in a multiple wiring structure.

11. A semiconductor device according to claim 10, wherein said plurality of output electrode pads contain a first array of output electrode pads and a second array of output electrode pads, the first and second arrays are disposed in parallel along the second relatively long side of said semiconductor substrate, and the output electrode pads in the second array are respectively shifted relative to the positioning of the respective output electrode pads in the first array by an amount intermediate the spacing distance between adjacently disposed output electrode pads within the first array.

12. A semiconductor device according to claim 11, wherein said internal circuit is a liquid crystal display driving circuit.

13. A semiconductor device according to claim 1, wherein said plurality of output electrode pads contain a first array of output electrode pads and a second array of output electrode pads, the first and second arrays are disposed in parallel along the second relatively long side of said semiconductor substrate, and the output electrode pads in the second array are respectively shifted relative to the positioning of the respective output electrode pads in the first array by an amount intermediate the spacing distance between adjacently disposed output electrode pads within the first array.

14. A semiconductor device according to claim 1, wherein said internal circuit is a liquid crystal display driving circuit.

15. A semiconductor device according to claim 1, wherein the output electrode pads have wiring occupancies that are equal.

16. A semiconductor device according to claim 15, wherein variations in the wiring occupancies of each output electrode pad are within 10%.

17. A semiconductor device according to claim 15, wherein variations in the wiring occupancies of each output electrode pad are within 5%.

* * * * *